(12) United States Patent
Lim et al.

(10) Patent No.: US 12,501,808 B2
(45) Date of Patent: Dec. 16, 2025

(54) DISPLAY APPARATUS

(71) Applicant: SAMSUNG DISPLAY CO., LTD., Yongin-si (KR)

(72) Inventors: Taewoo Lim, Yongin-si (KR); Moonsoon Kim, Yongin-si (KR); Jaeseung Kim, Yongin-si (KR); Seunghui Seo, Yongin-si (KR); Moonkeun Choi, Yongin-si (KR); Sangbeom Han, Yongin-si (KR); Kipyo Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 824 days.

(21) Appl. No.: 17/835,215

(22) Filed: Jun. 8, 2022

(65) Prior Publication Data
US 2023/0052275 A1 Feb. 16, 2023

(30) Foreign Application Priority Data
Aug. 13, 2021 (KR) ........................ 10-2021-0107530

(51) Int. Cl.
*H10K 59/38* (2023.01)
*H10K 59/122* (2023.01)
*H10K 59/80* (2023.01)
*H10K 59/88* (2023.01)

(52) U.S. Cl.
CPC .......... *H10K 59/38* (2023.02); *H10K 59/122* (2023.02); *H10K 59/877* (2023.02); *H10K 59/88* (2023.02)

(58) Field of Classification Search
None
See application file for complete search history.

(56) References Cited

U.S. PATENT DOCUMENTS

| | | | |
|---|---|---|---|
| 9,461,098 B2 | 10/2016 | Choi et al. | |
| 9,748,317 B2 | 8/2017 | Kim et al. | |
| 10,205,129 B2* | 2/2019 | Xu | H10K 59/8791 |
| 10,249,689 B2* | 4/2019 | Kim | G02B 5/3041 |
| 10,388,222 B2 | 8/2019 | Joo et al. | |
| 10,804,345 B2 | 10/2020 | Li et al. | |
| 11,778,885 B2 | 10/2023 | Kim et al. | |
| 2012/0098414 A1 | 4/2012 | Nakamura | |
| 2021/0384467 A1* | 12/2021 | Park | H10K 59/877 |

FOREIGN PATENT DOCUMENTS

| | | |
|---|---|---|
| CN | 110288904 A | 9/2019 |
| JP | 2020194018 A | 12/2020 |
| KR | 1020120111912 A | 10/2012 |
| KR | 1020160032742 A | 3/2016 |

(Continued)

*Primary Examiner* — Michelle Mandala
(74) *Attorney, Agent, or Firm* — CANTOR COLBURN LLP

(57) ABSTRACT

A display apparatus includes a first substrate including a display area and a non-display area surrounding the display area, a second substrate on the first substrate, a bank in which a first opening in the display area and a first dummy opening in the non-display area are defined, a first quantum dot layer filling the first opening, and a first dummy quantum dot layer filling the first dummy opening, where each of the first quantum dot layer and the first dummy quantum dot layer includes first quantum dots and first scatterers.

20 Claims, 13 Drawing Sheets

(56) References Cited

FOREIGN PATENT DOCUMENTS

| KR | 1020180070367 A | 6/2018 |
|----|-----------------|--------|
| KR | 102201827 B1 | 1/2021 |
| KR | 1020210086791 A | 7/2021 |
| TW | 1679792 B | 12/2019 |
| TW | I679792 B | 12/2019 |

* cited by examiner

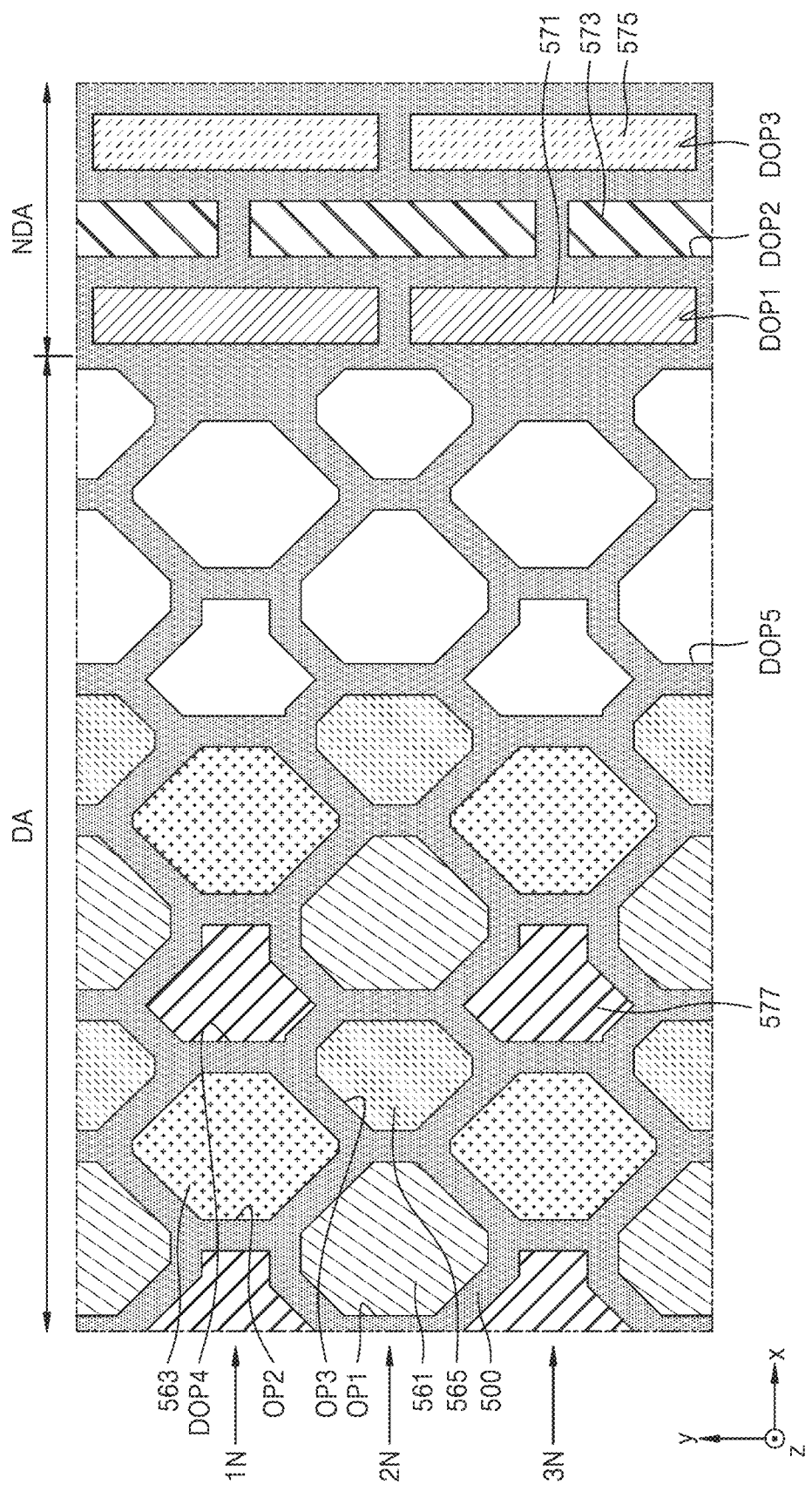

ID 10-2021-0107530, filed on Aug. 13, 2021, and all

DISPLAY APPARATUS

This application claims priority to Korean Patent Application No. 10-2021-0107530, filed on Aug. 13, 2021, and all the benefits accruing therefrom under 35 U.S.C. § 119, the content of which in its entirety is herein incorporated by reference.

BACKGROUND

1. Field

Embodiments relate to display apparatuses, and more particularly, to a display apparatus with improved display quality.

2. Description of the Related Art

With an advancement of various electronic apparatuses such as cell phones, personal digital assistants ("PDAs"), and large-sized televisions ("TVs"), various types of display apparatuses that may be applied thereto are being developed. In an embodiment, display apparatuses widely used in a market include a liquid crystal display including a backlight unit, and an organic light-emitting display that emits light of different colors for each color area, and recently, a display apparatus including a quantum dot color conversion layer ("QD-CCL") is being developed.

SUMMARY

Embodiments include a display apparatus with improved display quality. However, this feature does not limit the scope of the invention.

Additional features will be set forth in part in the description that follows and, in part, will be apparent from the description, or may be learned by practice of the embodiments of the invention.

In an embodiment of the invention, a display apparatus includes a first substrate including a display area and a non-display area surrounding the display area, a second substrate on the first substrate, a bank in which a first opening in the display area and a first dummy opening in the non-display area are defined, a first quantum dot layer filling the first opening, and a first dummy quantum dot layer filling the first dummy opening, where each of the first quantum dot layer and the first dummy quantum dot layer includes first quantum dots and first scattering particles.

In an embodiment, a second opening may be further defined in the bank in the display area and a second dummy opening may be further defined in the bank in the non-display area, the display apparatus may further include a second quantum dot layer filling the second opening and a second dummy quantum dot layer filling the second dummy opening, and each of the second quantum dot layer and the second dummy quantum dot layer may include second quantum dots and second scattering particles.

In an embodiment, a third opening may be further defined in the bank in the display area and a third dummy opening may be further defined in the bank in the non-display area, the display apparatus may further include a light-transmitting layer filling the third opening and a dummy light-transmitting layer filling the third dummy opening, and each of the light-transmitting layer and the dummy light-transmitting layer may include third scattering particles.

In an embodiment, the first quantum dot layer and the light-transmitting layer closest to the first quantum dot layer may be disposed in a same row as each other, and the first quantum dot layer and the second quantum dot layer closest to the first quantum dot layer may be disposed in different rows from each other.

In an embodiment, the first quantum dot layer and the first dummy quantum dot layer may be disposed in different rows from each other, and the second quantum dot layer and the first dummy quantum dot layer may be disposed in a same row.

In an embodiment, the display apparatus may further include a first color filter layer on a surface of the second substrate which faces the first substrate and overlapping the first quantum dot layer, a second color filter layer on the surface of the second substrate and overlapping the second quantum dot layer, and a third color filter layer on the surface of the second substrate and overlapping the light-transmitting layer.

In an embodiment, a fourth opening overlapping the second opening and a fifth opening overlapping the third opening may be defined in the first color filter layer, a sixth opening overlapping the first opening and a seventh opening overlapping the third opening may be defined in the second color filter layer, an eighth opening overlapping the first opening and a ninth opening overlapping the second opening may be defined in the third color filter layer.

In an embodiment, at least two of the first color filter layer, the second color filter layer, and the third color filter layer may be disposed between the bank and the second substrate.

In an embodiment, the first dummy quantum dot layer may overlap the first color filter layer, the second color filter layer, and the third color filter layer.

In an embodiment, the display apparatus may further include a protective layer between the first quantum dot layer and the first substrate, between the second quantum dot layer and the first substrate, and between the light-transmitting layer and the first substrate.

In an embodiment, the display apparatus may further include a column spacer between the first substrate and the bank.

In an embodiment, the display apparatus may further include a first light-emitting element disposed between the first substrate and the second substrate and including a first emission area overlapping the first quantum dot layer, a second light-emitting element disposed between the first substrate and the second substrate and including a second emission area overlapping the second quantum dot layer, and a third light-emitting element disposed between the first substrate and the second substrate and including a third emission area overlapping the light-transmitting layer.

In an embodiment, each of the first light-emitting element, the second light-emitting element, and the third light-emitting element may emit light belonging to a same wavelength.

In an embodiment, the display apparatus may further include a thin-film encapsulation layer that covers the first light-emitting element, the second light-emitting element, and the third light-emitting element.

In an embodiment, the display apparatus may further include a filler between the first substrate and the second substrate, where the filler is arranged on the thin-film encapsulation layer.

In an embodiment, a fourth dummy opening may be further defined in the bank in the display area, the display apparatus may further include a third dummy quantum dot layer filling the fourth dummy opening, and the third dummy quantum dot layer may include at least one of the first quantum dots, the second quantum dots, and the third scattering particles.

In an embodiment of the invention, a display apparatus includes a first substrate including a display area and a non-display area surrounding the display area, a second substrate above the first substrate, a bank in which a first opening in the display area and a first dummy opening in the non-display area are defined, a first quantum dot layer filling the first opening, and a first dummy quantum dot layer filling the first dummy opening, where the first quantum dot layer and the first dummy quantum dot layer are arranged in different rows from each other.

In an embodiment, a second opening and a third opening may be further defined in the bank in the display area and a second dummy opening and a third dummy opening may be further defined in the bank in the non-display area, and the display apparatus may further include a second quantum dot layer filling the second opening, a light-transmitting layer filling the third opening, a second dummy quantum dot layer filling the second dummy opening, and a dummy light-transmitting layer filling the third dummy opening.

In an embodiment, the first quantum dot layer and the light-transmitting layer closest to the first quantum dot layer may be disposed in a same row as each other, and the first quantum dot layer and the second quantum dot layer closest to the first quantum dot layer may be disposed in different rows from each other.

In an embodiment, the second quantum dot layer and the first dummy quantum dot layer may be disposed in a same row.

Other embodiments, features, and advantages other than those described above will become apparent from the accompanying drawings, the appended claims, and the detailed description of the invention.

BRIEF DESCRIPTION OF THE DRAWINGS

The above and other embodiments, features, and advantages of the invention will be more apparent from the following description taken in conjunction with the accompanying drawings, in which:

FIG. 13 is a plan view schematically illustrating an embodiment of a display apparatus.

DETAILED DESCRIPTION

Figure 1:
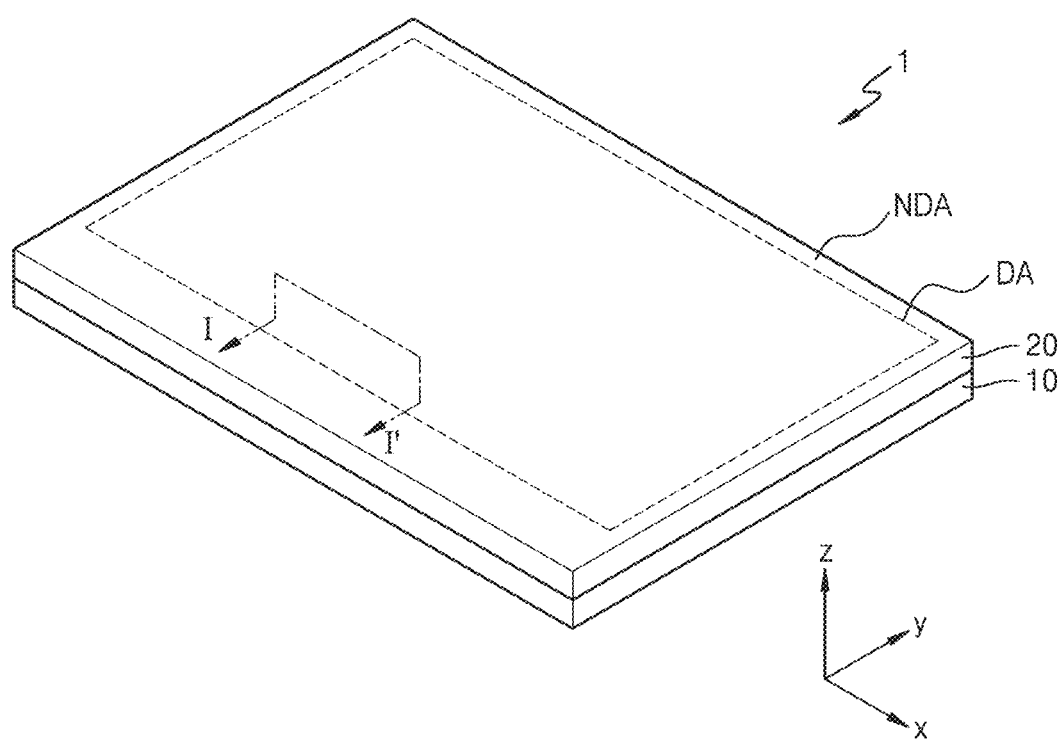
FIG. 1 is a perspective view schematically illustrating an embodiment of a display apparatus.

Reference will now be made in detail to embodiments, examples of which are illustrated in the accompanying drawings, where like reference numerals refer to like elements throughout the disclosure. In this regard, the embodiments of the disclosure may have different forms and should not be construed as being limited to the descriptions set forth herein. Accordingly, the embodiments are merely described below, by referring to the drawing figures, to explain features of the description of the disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or any variations thereof.

The disclosure may, however, be embodied in many different forms and should not be construed as being limited to the embodiments set forth herein. Effects and features of the disclosure, and methods for achieving the same will be clarified with reference to embodiments described below in detail with reference to the drawings. However, the embodiments of the disclosure may be implemented in various forms, not by being limited to the embodiments presented below.

In an embodiment below, terms such as "first" and "second" are used herein merely to describe a variety of constituent elements, but the constituent elements are not limited by the terms. Such terms are used only for the purpose of distinguishing one constituent element from another constituent element.

In an embodiment below, an expression used in the singular encompasses the expression of the plural, unless it has a clearly different meaning in the context.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

In the drawings, sizes of components in the drawings may be exaggerated or reduced for convenience of explanation. In other words, because sizes and thicknesses of components in the drawings are arbitrarily illustrated for convenience of description, the following embodiments are not limited thereto.

In the specification, "A and/or B" means A or B, or A and B. In addition, in the specification, "at least one of A and B" means A or B, or A and B.

In the following embodiments, the meaning that a line "extends in a first direction or a second direction" includes not only extending in a straight line, but also extending in a zigzag or curve in the first direction or the second direction.

In the following embodiments, when it is referred to as "in a plan view," it means when a target portion is viewed from above, and when it is referred to as "in a cross-sectional view," it means when a cross-section of the target portion is vertically cut and viewed from a side. In the following embodiments, "overlapping" includes overlapping "in a plan view" and overlapping "in a cross-sectional view."

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments will be described with reference to the accompanying drawings, where like reference numerals refer to like elements throughout the disclosure.

Figure 2:
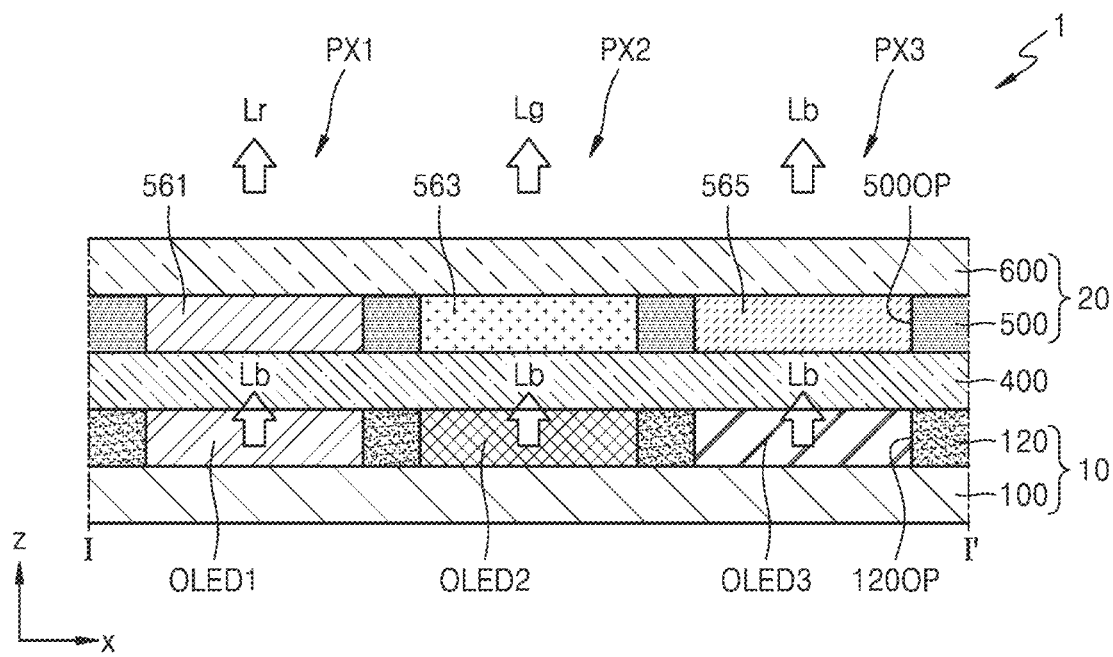
FIG. 2 is a cross-sectional view schematically illustrating an embodiment of a display apparatus.
Figure 3:
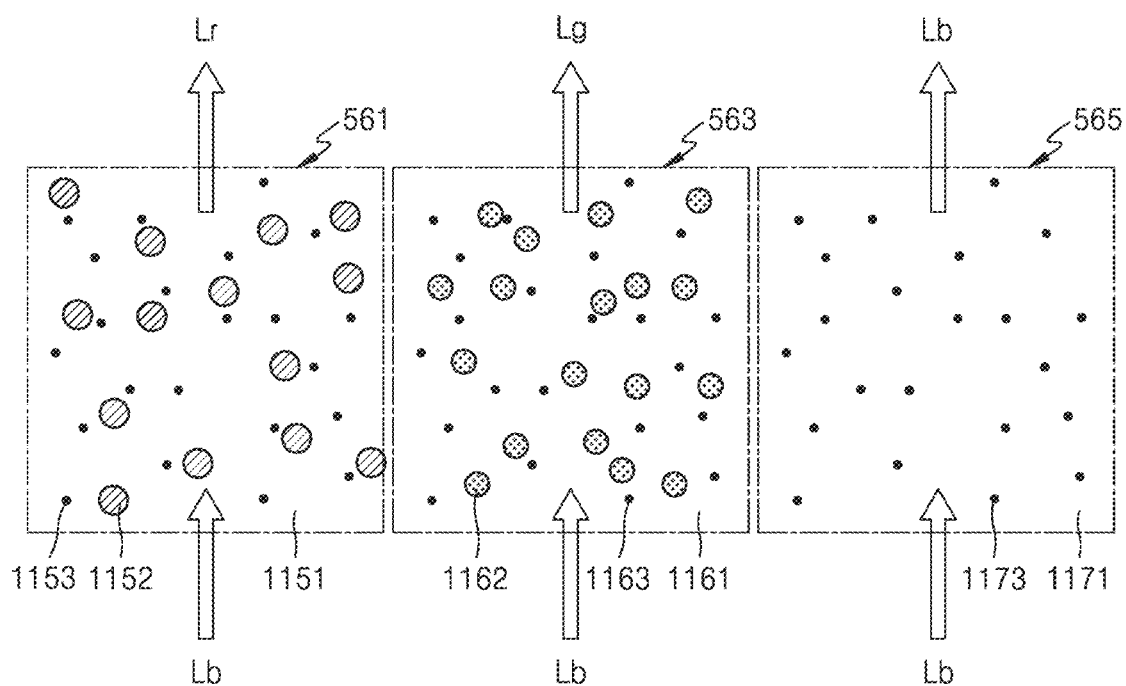
FIG. 3 is a cross-sectional view schematically illustrating portions of each of a first quantum dot layer, a second quantum dot layer, and a light-transmitting layer of FIG. 2.

FIG. 1 is a perspective view schematically illustrating an embodiment of a display apparatus 1, FIG. 2 is a cross-sectional view schematically illustrating an embodiment of a display apparatus 1, and FIG. 3 is a cross-sectional view schematically illustrating portions of each of a first quantum dot layer, a second quantum dot layer, and a light-transmitting layer of FIG. 2. FIG. 2 corresponds to a cross-sectional view of the display apparatus 1 in FIG. 1, taken along line I-I' in FIG. 1.

Referring to FIG. 1, the display apparatus 1 may include a display area DA and a non-display area NDA surrounding the display area DA. The display apparatus 1 may provide an image by an array of a plurality of pixels that are two-dimensionally arranged in the display area DA.

Each of the pixels of the display apparatus 1 may include an area in which light of a color may be emitted, and the display apparatus 1 may provide an image by light emitted from the pixels. In an embodiment, each of the pixels may emit red, green, or blue light, for example.

The non-display area NDA may include an area in which an image is not provided, and may entirely surround the display area DA. A driver or a main power line for providing an electrical signal or power to pixel circuits may be arranged in the non-display area NDA. A pad to which an electronic element or a printed circuit board may be electrically connected may be included in the non-display area NDA.

The display area DA may have a polygonal shape including a quadrangular shape, as shown in FIG. 1. In an embodiment, the display area DA may have a rectangular shape of which a length is greater than a width, a rectangular shape of which a length is less than a width, or a square shape, for example. In some embodiments, the display area DA may have various shapes such as an elliptical shape or a circular shape.

In an embodiment, the display apparatus 1 may include a light-emitting panel 10 and a color panel 20, which are stacked in a thickness direction (e.g., a z direction). Referring to FIG. 2, the light-emitting panel 10 may include first to third light-emitting elements OLED1, OLED2, and OLED3 on a lower substrate 100. In this case, the first to third light-emitting elements OLED1, OLED2, and OLED3 may be organic light-emitting diodes. However, the invention is not limited thereto. The first to third light-emitting elements OLED1, OLED2, and OLED3 may be inorganic light-emitting diodes, and various modifications may be made.

Light (e.g., blue light Lb) emitted by the first to third light-emitting elements OLED1, OLED2, and OLED3 may be converted into red light Lr, green light Lg, and blue light Lb or may transmit through the color panel 20 by passing through the color panel 20.

In an embodiment, a pixel-defining layer 120 defining emission areas of the first to third light-emitting elements OLED1, OLED2, and OLED3 may be arranged on the lower substrate 100. In other words, openings 120OP respectively corresponding to the emission areas of the first to third light-emitting elements OLED1, OLED2, and OLED3 may be defined in the pixel-defining layer 120.

In an embodiment, the pixel-defining layer 120 may include an organic insulating material. In some embodiments, the pixel-defining layer 120 may include an inorganic insulating material such as silicon nitride ($SiN_x$), silicon oxynitride ($SiO_xN_y$), or silicon oxide ($SiO_x$). In some embodiments, the pixel-defining layer 120 may include an organic insulating material and an inorganic insulating material. In an embodiment, the pixel-defining layer 120 may include a light-blocking material, and may be provided in black. In an embodiment, the light-blocking material may include carbon black, carbon nanotubes, and a resin or paste including black dye, metal particles (e.g., nickel, aluminum, molybdenum, and any alloys thereof), metal oxide particles (e.g., chromium oxide), metal nitride particles (e.g., chromium nitride), or the like. When the pixel-defining layer 120 includes a light-blocking material, external light reflection due to metal structures arranged below the pixel-defining layer 120 may be reduced.

Although not shown, a spacer may be arranged on the pixel-defining layer 120. In an embodiment, the spacer may include an organic insulating material such as polyimide. In some embodiments, the spacer may include an inorganic insulating material such as $SiN_x$ or $SiO_x$, or may include an organic insulating material and an inorganic insulating material.

In an embodiment, the spacer may include the same material as that of the pixel-defining layer 120. In this case, the pixel-defining layer 120 and the spacer may be provided together in a mask process that uses a half-tone mask or the like. In some embodiments, the pixel-defining layer 120 and the spacer may include different materials from each other.

In an embodiment, a filler 400 may be arranged between the lower substrate 100 and an upper substrate 600. The filler 400 may act as a buffer against external pressure or the like. In an embodiment, the filler 400 may include an organic material such as methyl silicone, phenyl silicone, or polyimide. However, the invention is not limited thereto, and the filler 400 may include urethane-based resin, epoxy-based resin, and acryl-based resin, which are organic sealants, or silicone, which is an inorganic sealant.

In an embodiment, a bank 500 may be arranged on the filler 400. The bank 500 may include various materials capable of absorbing light. The bank 500 may include the same material as that of the pixel-defining layer 120, or may include a material different from that of the pixel-defining layer 120. In an embodiment, the bank 500 may include an opaque inorganic insulating material such as chromium oxide or molybdenum oxide, or may include an opaque organic insulating material such as black resin, for example.

In an embodiment, openings 5000P respectively corresponding to emission areas of the first to third light-emitting elements OLED1, OLED2, and OLED3 may be defined in the bank 500. In an embodiment, the openings 5000P defined in the bank 500 may correspond to the openings 120OP defined in the pixel-defining layer 120, respectively, for example. In an embodiment, a first quantum dot layer 561, a second quantum dot layer 563, and a light-transmitting layer 565 may be arranged in the openings 5000P defined in the bank 500, respectively.

Referring to FIGS. 2 and 3, the first quantum dot layer 561 may convert incident blue light Lb into red light Lr. The first quantum dot layer 561 may include first quantum dots 1152, first scattering particles 1153, and a first photosensitive polymer 1151. The first quantum dots 1152 and the first scattering particles 1153 may be dispersed in the first photosensitive polymer 1151.

The first quantum dots 1152 may be excited by the blue light Lb and may isotropically emit red light Lr having a wavelength greater than that of the blue light Lb. The first photosensitive polymer 1151 may include a light-transmitting organic material. The first scattering particles 1153 may scatter blue light Lb not absorbed by the first quantum dots 1152 so that more first quantum dots 1152 are excited, thereby increasing color conversion efficiency. In an embodiment, the first scattering particles 1153 may include, for example, titanium oxide ($TiO_2$) or metal particles. The first quantum dots 1152 may include one of Group II-VI compounds, Group III-V compounds, Group IV-VI compounds, Group IV elements, Group IV compounds, and any combinations thereof.

In an embodiment, the first quantum dot layer 561 may convert light of a third wavelength band into light of a first wavelength band. In an embodiment, when the first light-emitting element OLED1 generates light of a wavelength in a range of about 450 nanometers (nm) to about 495 nm, the first quantum dot layer 561 may convert that light into light of a wavelength in a range of about 630 nm to about 780 nm, for example. Accordingly, light of a wavelength in the range of about 630 nm to about 780 nm may be emitted from a first pixel PX1 to the outside through the upper substrate 600.

In an embodiment, the second quantum dot layer 563 may include second quantum dots 1162, second scattering particles 1163, and a second photosensitive polymer 1161. The second quantum dots 1162 and the second scattering particles 1163 may be dispersed in the second photosensitive polymer 1161. The second quantum dots 1162 may be excited by the blue light Lb and may isotropically emit green light Lg having a wavelength greater than that of the blue light Lb. The second photosensitive polymer 1161 may include a light-transmitting organic material. The second scattering particles 1163 may scatter blue light Lb not absorbed by the second quantum dots 1162 so that more second quantum dots 1162 are excited, thereby increasing color conversion efficiency. In an embodiment, the second scattering particles 1163 may include, for example, $TiO_2$ or metal particles. In an embodiment, the second quantum dots 1162 may include one of Group II-VI compounds, Group III-V compounds, Group IV-VI compounds, Group IV elements, Group IV compounds, and any combinations thereof. In an embodiment, the second quantum dots 1162 may include the same material as that of the first quantum dots 1152. In an embodiment, a size of each of the second quantum dots 1162 may be less than a size of each of the first quantum dots 1152.

In an embodiment, the second quantum dot layer 563 may convert light of the third wavelength band into light of a second wavelength band. In an embodiment, when the second light-emitting element OLED2 generates light of a wavelength in a range of about 450 nm to about 495 nm, the second quantum dot layer 563 may convert that light into light of a wavelength in a range of about 495 nm to about 570 nm, for example. Accordingly, light Lg of a wavelength in the range of about 495 nm to about 570 nm may be emitted from a second pixel PX2 to the outside through the upper substrate 600.

The light-transmitting layer 565 may transmit blue light Lb. The light-transmitting layer 565 may include third scattering particles 1173 and a third photosensitive polymer 1171. The third scattering particles 1173 may be dispersed in the third photosensitive polymer 1171. In an embodiment, the third photosensitive polymer 1171 may include a light-transmitting organic material such as silicon resin or epoxy resin, and may include the same material as that of the first and second photosensitive polymers 1151 and 1161 described above. The third scattering particles 1173 may scatter and emit the blue light Lb, and may include the same material as that of the first and second scattering particles 1153 and 1163.

In an embodiment, the first quantum dot layer 561, the second quantum dot layer 563, and the light-transmitting layer 565 may be provided in the opening 5000P of the bank 500 by an inkjet printing method.

In an embodiment, the upper substrate 600 may be arranged on the first quantum dot layer 561, the second quantum dot layer 563, and the light-transmitting layer 565. A first color filter layer 581 (refer to FIG. 6) may be arranged between the first quantum dot layer 561 and the upper substrate 600, a second color filter layer 583 (refer to FIG. 6) may be arranged between the second quantum dot layer 563 and the upper substrate 600, and a third color filter layer 585 (refer to FIG. 6) may be arranged between the light-transmitting layer 565 and the upper substrate 600. This is further described below with reference to FIG. 6.

The lower substrate 100 and the upper substrate 600 may each include glass, metal, or polymer resin. In an embodiment, when the lower substrate 100 and the upper substrate 600 are flexible or bendable, the lower substrate 100 and the upper substrate 600 may each include polymer resin such as polyether sulfone, polyacrylate, polyetherimide, polyethylene naphthalate, polyethylene terephthalate, polyphenylene sulfide, polyarylate, polyimide, polycarbonate, or cellulose acetate propionate. However, the lower substrate 100 and the upper substrate 600 may each have a multi-layer structure including two layers each including the polymer resin described above, and a barrier layer therebetween, the barrier layer including an inorganic material such as $SiN_x$, $SiO_xN_y$, or $SiO_x$, and various modifications may be made.

In an embodiment, the display apparatus 1 may be provided through a process of forming the first to third light-emitting elements OLED1, OLED2, and OLED3 on the lower substrate 100, forming the first and second quantum dot layers 561 and 563 and the light-transmitting layer 565 on the upper substrate 600, and then bonding the lower substrate 100 and the upper substrate 600 to each other.

Figure 4:
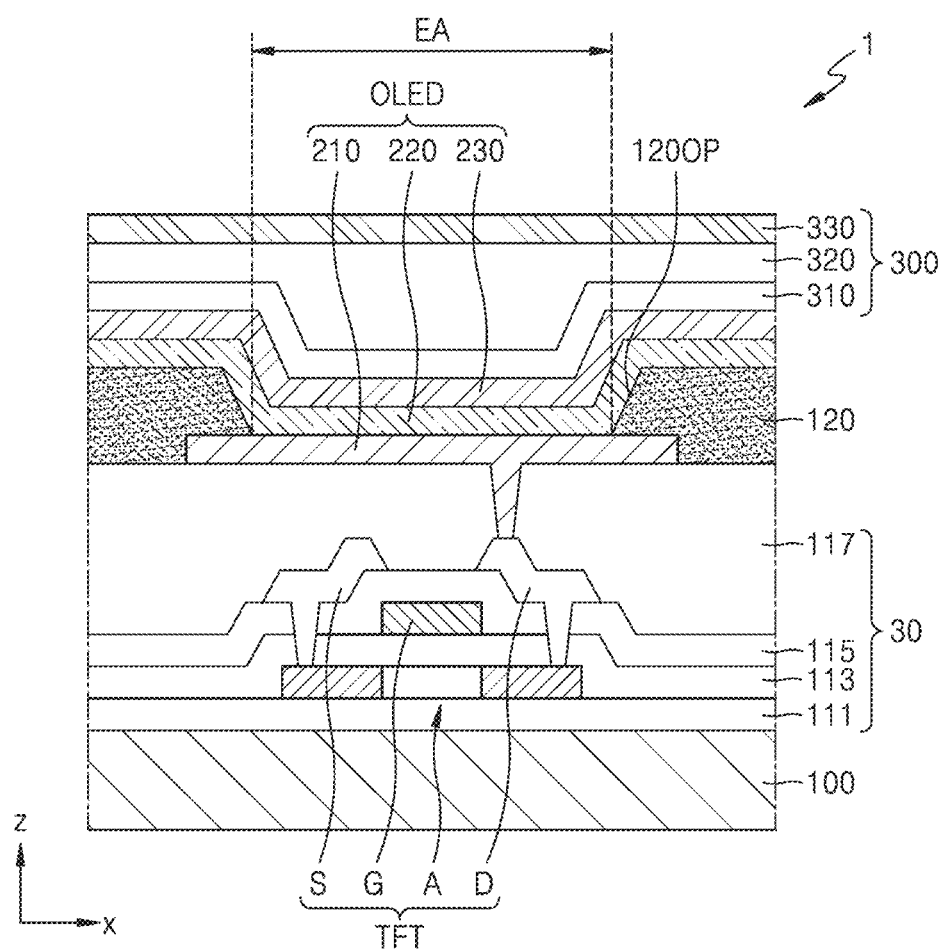
FIG. 4 is a cross-sectional view schematically illustrating an embodiment of a display apparatus.

FIG. 4 is a cross-sectional view schematically illustrating an embodiment of a display apparatus 1.

Referring to FIG. 4, a thin-film transistor TFT, a light-emitting element OLED, and a thin-film encapsulation layer 300 may be arranged on the lower substrate 100. A buffer layer 111 may be arranged on the lower substrate 100. In an embodiment, the buffer layer 111 may include an inorganic material such as $SiN_x$, $SiO_xN_y$, or $SiO_x$. The buffer layer 111 may be arranged on the lower substrate 100 to increase the smoothness of an upper surface of the lower substrate 100 or to prevent or minimize impurities from the lower substrate 100 or the like from penetrating into a semiconductor layer A of the thin-film transistor TFT.

The thin-film transistor TFT may be arranged on the buffer layer 111. The thin-film transistor TFT may include the semiconductor layer A, a gate electrode G, a source electrode S, and a drain electrode D. The semiconductor layer A may be arranged on the buffer layer 111. In an embodiment, the semiconductor layer A may include amorphous silicon, polycrystalline silicon, an organic semiconductor material, or an oxide semiconductor material.

A first insulating layer 113 may be arranged on the semiconductor layer A. In an embodiment, the first insulating layer 113 may include an inorganic material such as $SiN_x$, $SiO_xN_y$, or $SiO_x$, and may include a single layer or layers including the material described above. The first insulating layer 113 may be between the semiconductor layer A and the gate electrode G to ensure insulation of the semiconductor layer A and the gate electrode G.

The gate electrode G may be arranged on the first insulating layer 113. In an embodiment, the gate electrode G may include a low-resistance conductive material such as molybdenum (Mo), aluminum (Al), copper (Cu), and/or titanium (Ti), and may include a single layer or layers including the material described above.

A second insulating layer 115 may be arranged on the gate electrode G. In an embodiment, the second insulating layer 115 may include an inorganic material such as $SiN_x$, $SiO_xN_y$, or $SiO_x$, and may include a single layer or layers including the material described above.

The source electrode S and the drain electrode D may be arranged on the second insulating layer 115. In an embodiment, the source electrode S and the drain electrode D may each include at least one material of Cu, Ti, and Al. In an embodiment, each of the source electrode S and the drain electrode D may have a three-layer structure including a Ti layer, an Al layer, and another Ti layer, for example.

A planarization layer 117 may be arranged on the source electrode S and the drain electrode D. The planarization layer 117 may include a single polyimide-based resin layer. However, the invention is not limited thereto. In an embodiment, the planarization layer 117 may include at least one of acryl-based resin, methacryl-based resin, polyisoprene, vinyl-based resin, epoxy-based resin, urethane-based resin, cellulose-based resin, siloxane-based resin, polyamide-based resin, and perylene-based resin.

The light-emitting element OLED may be arranged on the planarization layer 117. The light-emitting element OLED may include a pixel electrode 210, an intermediate layer 220, and an opposite electrode 230. The pixel electrode 210 may be arranged on the planarization layer 117. The pixel electrode 210 may be electrically connected to the source electrode S and/or the drain electrode D through a via hole defined in the planarization layer 117. Accordingly, the light-emitting element OLED may be electrically connected to the thin-film transistor TFT.

In an embodiment, the pixel electrode 210 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, the pixel electrode 210 may include a reflective layer including silver (Ag), magnesium (Mg), Al, platinum (Pt), palladium (Pd), gold (Au), nickel (Ni), neodymium (Nd), iridium (Ir), chromium (Cr), or any compounds thereof. In an embodiment, the pixel electrode 210 may further include a layer including ITO, IZO, ZnO, or $In_2O_3$ on or below the reflective layer described above. In an embodiment, the pixel electrode 210 may have a multi-layer structure of an ITO layer, an Al layer, and another ITO layer, for example.

A pixel-defining layer 120 in which an opening 120OP is defined may be arranged on the pixel electrode 210, and the opening 120OP may expose at least a portion of the pixel electrode 210. The opening 120OP defined in the pixel-defining layer 120 may define an emission area EA of light emitted by the light-emitting element OLED. In an embodiment, a width of the opening 120OP defined in the pixel-defining layer 120 may correspond to a width of the emission area EA, for example. A peripheral area of the emission area EA may include a non-light-emitting area, and the non-light-emitting area may surround the emission area EA.

The intermediate layer 220 including an emission layer may be arranged on the pixel electrode 210. The intermediate layer 220 may include a low-molecular weight or polymer material. When the intermediate layer 220 includes a low-molecular weight material, the intermediate layer 220 may have a structure in which a hole injection layer ("HIL"), a hole transport layer ("HTL"), an emission layer ("EML"), an electron transport layer ("ETL"), an electron injection layer ("EIL"), etc., are stacked to have a single or complex structure, and may be provided by a vacuum deposition method. When the intermediate layer 220 includes a polymer material, the intermediate layer 220 may have a structure including an HTL and an EML. In this case, the HTL may include poly(3,4-ethylenedioxythiophene) ("PEDOT"), and the EML may include a polymer material such as a poly-phenylenevinylene ("PPV")-based material or a polyfluorene-based material. However, the intermediate layer 220 is not necessarily limited thereto, and may have various structures. The intermediate layer 220 may be provided by screen printing, an inkjet printing method, a deposition method, laser induced thermal imaging ("LITI"), or the like.

In an embodiment, the intermediate layer 220 may include an EML, and the EML may emit light of the third wavelength band. In an embodiment, the EML may emit light of a wavelength in a range of about 450 nm to about 495 nm, for example. The EML may be unitarily provided as a single body to entirely cover the lower substrate 100. However, the invention is not limited thereto. The EML may be patterned for each pixel electrode 210 to correspond to the opening 120OP of the pixel-defining layer 120.

The opposite electrode 230 may be arranged on the intermediate layer 220. The opposite electrode 230 may include a conductive material having a low work function. In an embodiment, the opposite electrode 230 may include a (semi-)transparent layer including Ag, Mg, Al, Pt, Pd, Au, Ni, Nd, Ir, Cr, lithium (Li), calcium (Ca), or any alloys thereof, for example. In some embodiments, the opposite electrode 230 may further include a layer including ITO, IZO, ZnO, or $In_2O_3$ on the (semi-)transparent layer including the material described above.

Although not shown, a capping layer may be further arranged on the opposite electrode 230. The capping layer may include lithium fluoride (LiF), an inorganic material, or/and an organic material.

Because the light-emitting element as described above may be easily damaged by external moisture or oxygen, an encapsulation layer may cover and protect the light-emitting element as necessary. The encapsulation layer may include the thin-film encapsulation layer 300 including at least one inorganic film layer and at least one organic film layer. In this case, the thin-film encapsulation layer 300 may include a first inorganic film layer 310, an organic film layer 320, and a second inorganic film layer 330, which are sequentially stacked.

The first inorganic film layer 310 may be arranged directly on the opposite electrode 230. The first inorganic film layer 310 may prevent or minimize external moisture or oxygen from penetrating into the light-emitting element OLED.

The organic film layer 320 may be arranged directly on the first inorganic film layer 310. The organic film layer 320 may provide a flat surface on the first inorganic film layer 310. Curves, particles, or the like formed or provided on an upper surface of the first inorganic film layer 310 may be covered with the organic film layer 320 so that elements provided on the organic film layer 320 may be prevented from being affected by a surface condition of the upper surface of the first inorganic film layer 310.

The second inorganic film layer 330 may be arranged directly on the organic film layer 320. The second inorganic film layer 330 may prevent or minimize the release of moisture, etc., discharged from the organic film layer 320 to the outside.

In an embodiment, the first inorganic film layer 310 and the second inorganic film layer 330 may each include $SiO_x$, $SiN_x$, $SiO_xN_y$, $Al_2O_3$, $TiO_2$, tantalum oxide ($Ta_2O_5$), hafnium oxide ($HfO_2$), zinc oxide ($ZnO_x$), or the like. In this case, ZnO may be ZnO and/or zinc peroxide ($ZnO_2$). The first inorganic film layer 310 and the second inorganic film layer 330 may each have a single layer or layers including the material described above. The organic film layer 320 may include a polymer-based material. In an embodiment, the polymer-based material may include acryl-based resin, epoxy-based resin, polyimide, polyethylene, or the like. In an embodiment, the organic film layer 320 may include acrylate.

In an embodiment, elements arranged between the lower substrate 100 and the pixel-defining layer 120 may be collectively referred to as an insulating layer 30.

Figure 5:
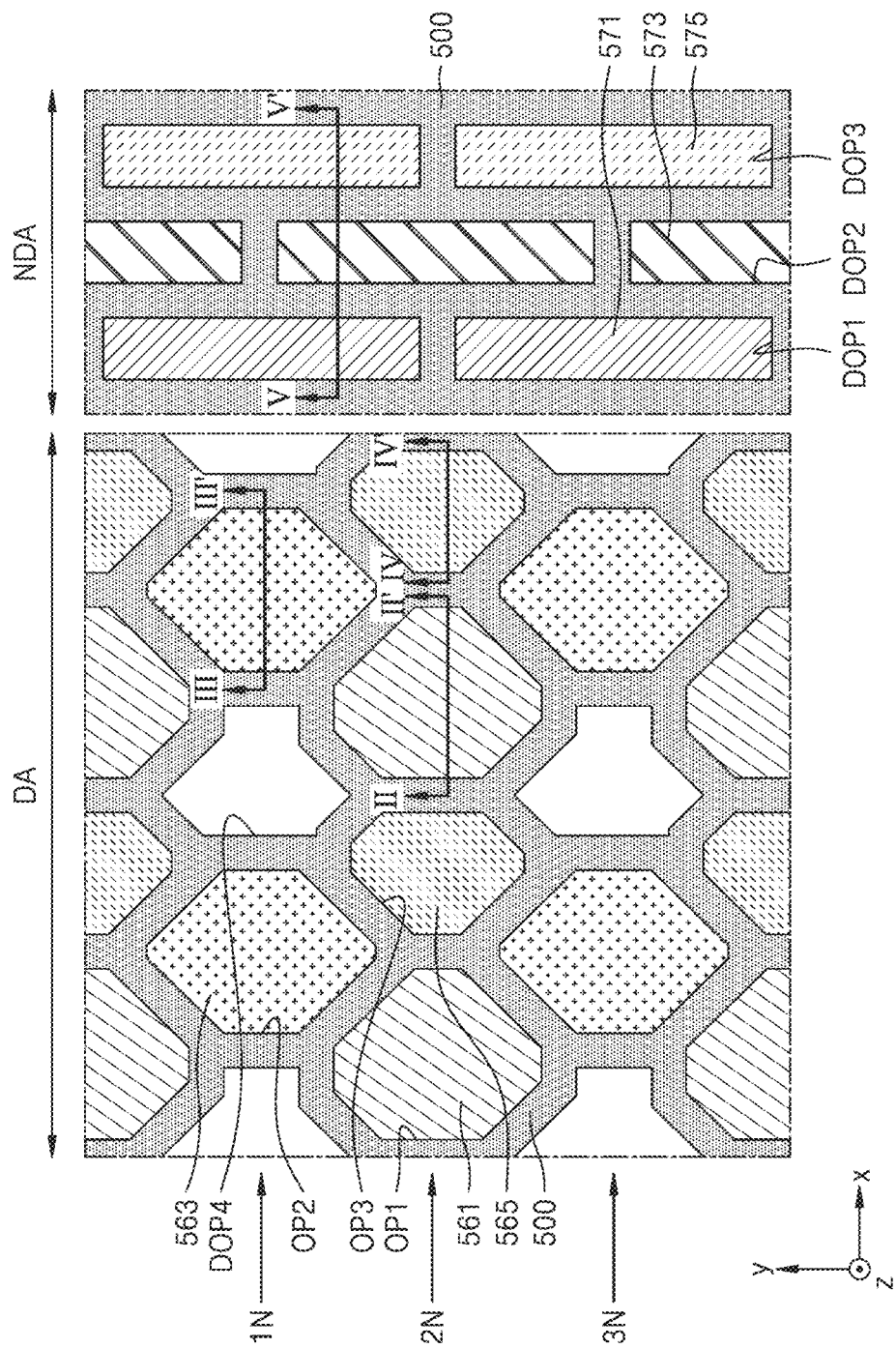
FIG. 5 is a plan view schematically illustrating an embodiment of a display apparatus.
Figure 6:
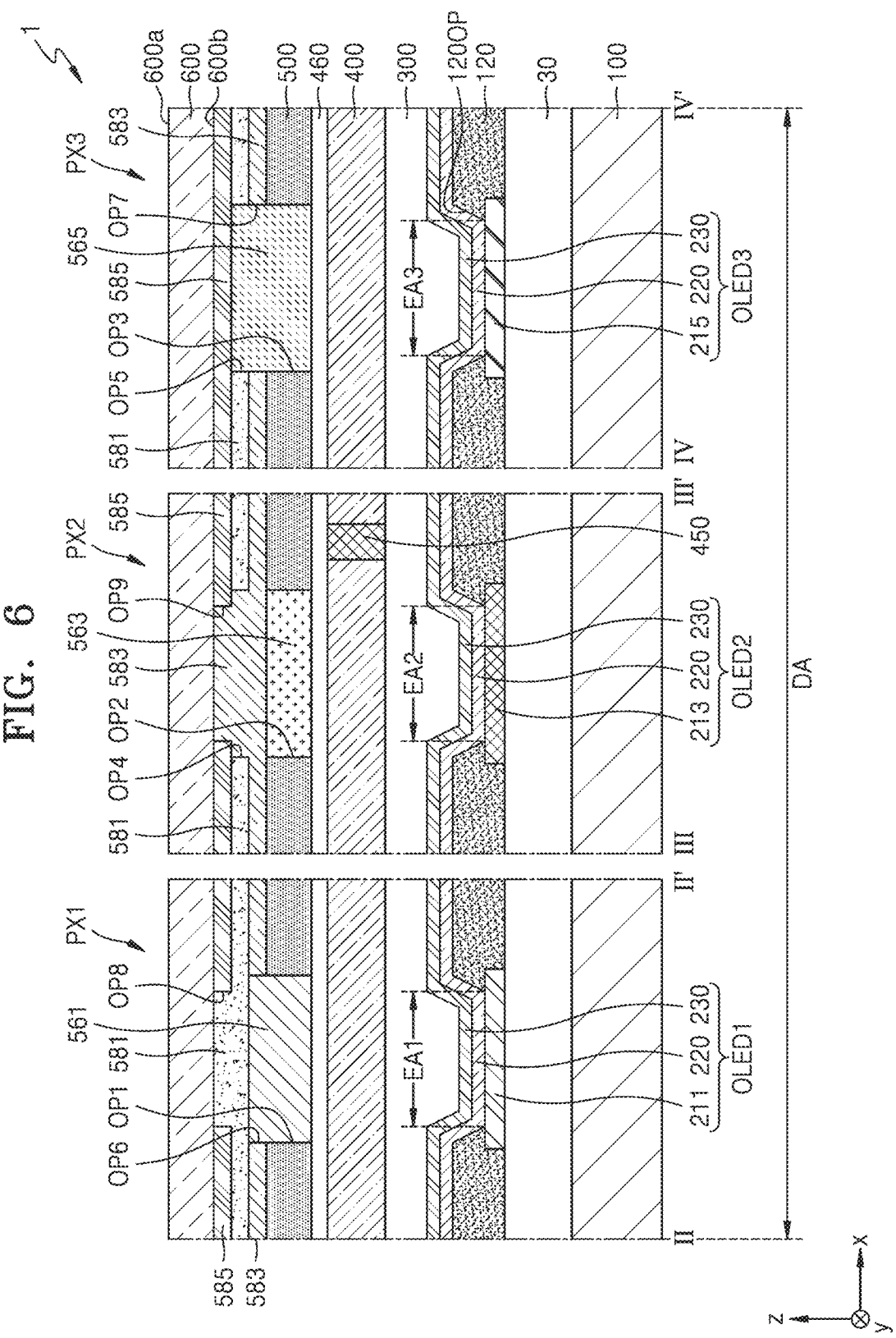
FIG. 6 is a cross-sectional view schematically illustrating an embodiment of a display apparatus.
Figure 7:
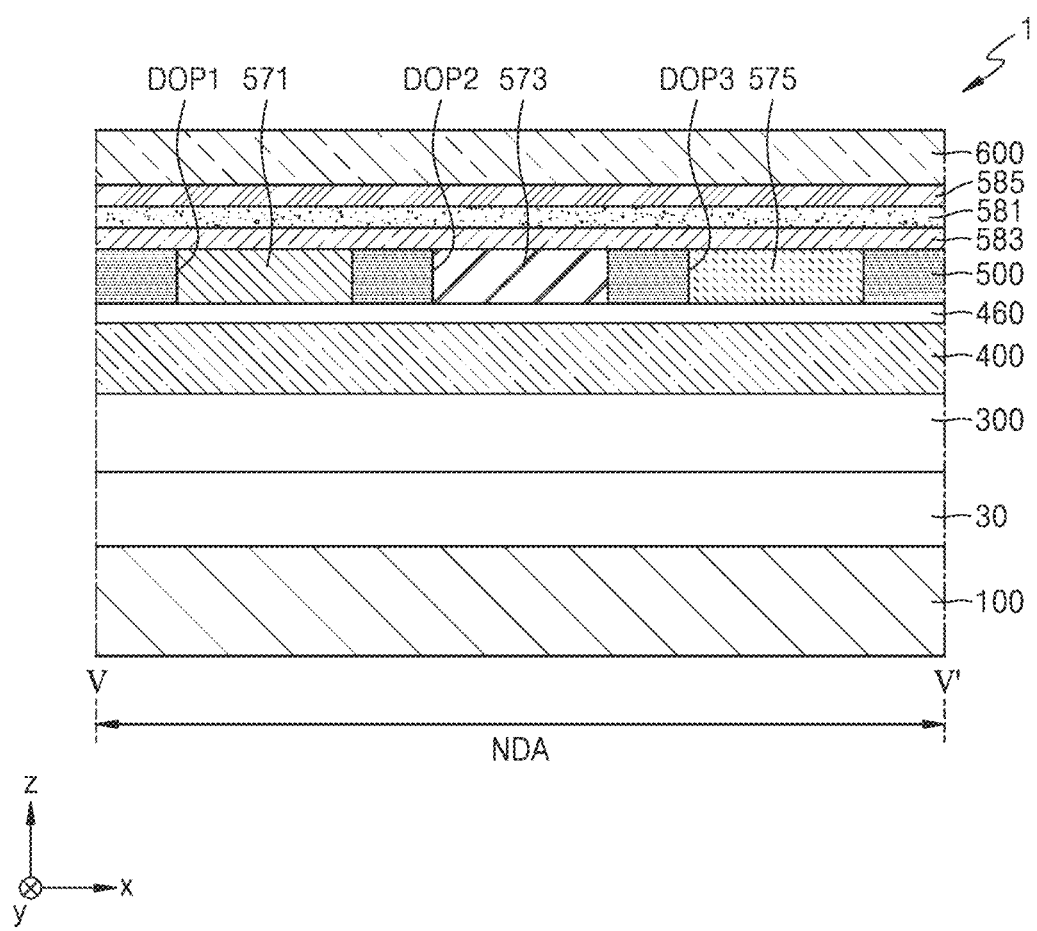
FIG. 7 is a cross-sectional view schematically illustrating an embodiment of a display apparatus.

FIG. 5 is a plan view schematically illustrating an embodiment of a display apparatus, FIG. 6 is a cross-sectional view schematically illustrating an embodiment of a display apparatus 1, and FIG. 7 is a cross-sectional view schematically illustrating an embodiment of a display apparatus 1. Specifically, FIG. 5 is a plan view schematically illustrating a portion of the display area DA and the non-display area NDA, FIG. 6 is a cross-sectional view of the display apparatus in FIG. 5, taken along lines and IV-IV' in FIG. 5, and FIG. 7 is a cross-sectional view of the display apparatus in FIG. 5, taken along line V-V in FIG. 5.

Referring to FIGS. 5 and 6, the insulating layer 30 may be arranged on the lower substrate 100. As described above with reference to FIG. 4, the insulating layer 30 may include the buffer layer 111, the first insulating layer 113, the second insulating layer 115, and the planarization layer 117, and the thin-film transistor TFT may be arranged in the insulating layer 30.

A first pixel electrode 211, a second pixel electrode 213, and a third pixel electrode 215 may be arranged on the insulating layer 30. The pixel-defining layer 120 may be arranged on the first to third pixel electrodes 211, 213, and 215, and the opening 120OP that exposes at least a portion of each of the first to third pixel electrodes 211, 213, and 215 may be defined in the pixel-defining layer 120. First to third emission areas EA1, EA2, and EA3 of first to third pixels PX1, PX2, and PX3 may be defined by the opening 120OP defined in the pixel-defining layer 120.

The first light-emitting element OLED1 may have the first emission area EA1, and the first emission area EA1 of the first light-emitting element OLED1 may be defined by the opening 120OP of the pixel-defining layer 120. In this case, the first emission area EA1 may correspond to an emission area of light emitted by the first light-emitting element OLED1.

The second light-emitting element OLED2 may have the second emission area EA2, and the second emission area EA2 of the second light-emitting element OLED2 may be defined by the opening 120OP of the pixel-defining layer 120. In this case, the second emission area EA2 may correspond to an emission area of light emitted by the second light-emitting element OLED2.

The third light-emitting element OLED3 may have the third emission area EA3, and the third emission area EA3 of the third light-emitting element OLED3 may be defined by the opening 120OP of the pixel-defining layer 120. In this case, the third emission area EA3 may correspond to an emission area of light emitted by the third light-emitting element OLED3.

In addition, by increasing a distance between an edge of the first pixel electrode 211 and the opposite electrode 230, a distance between an edge of the second pixel electrode 213 and the opposite electrode 230, and a distance between an edge of the third pixel electrode 215 and the opposite electrode 230, the pixel-defining layer 120 may prevent an arc or the like from occurring at the edges of the first pixel electrode 211 to third pixel electrode 215.

The intermediate layer 220 may be arranged on the first pixel electrode 211 to the third pixel electrode 215, and the opposite electrode 230 may be arranged on the intermediate layer 220. The intermediate layer 220 may be unitarily provided as a single body across the first pixel electrode 211 to the third pixel electrode 215. However, the invention is not limited thereto. The intermediate layer 220 may be patterned on the first to third pixel electrodes 211, 213, and 215.

The thin-film encapsulation layer 300 may be arranged on each of the first light-emitting element OLED1 to the third light-emitting element OLED3. As described above with reference to FIG. 4, the thin-film encapsulation layer 300 may have a structure in which the first inorganic film layer 310, the organic film layer 320, and the second inorganic film layer 330 are sequentially stacked.

The upper substrate 600 may be arranged above the lower substrate 100 such that the first light-emitting element OLED1 including the first pixel electrode 211, the second light-emitting element OLED2 including the second pixel electrode 213, and the third light-emitting element OLED3 including the third pixel electrode 215 are between the upper substrate 600 and the lower substrate 100. The upper substrate 600 may include polymer resin. In an embodiment, the upper substrate 600 may include polymer resin such as polyether sulfone, polyacrylate, polyetherimide, polyethylene naphthalate, polyethylene terephthalate, polyphenylene sulfide, polyarylate, polyimide, polycarbonate, or cellulose acetate propionate. However, the upper substrate 600 may have a multi-layer structure including two layers each including polymer resin and a barrier layer therebetween, and the barrier layer may include an inorganic material such as $SiN_x$, $SiO_xN_y$, or $SiO_x$, and various modifications may be made. The upper substrate 600 described above may be flexible or bendable.

In an embodiment, the upper substrate 600 may include an upper surface 600*a* and a lower surface 600*b*. In this case, the lower surface 600*b* may refer to a surface closer to the lower substrate 100 than the upper surface 600*a* is to the lower substrate 100.

In an embodiment, the bank 500 may be arranged between the lower substrate 100 and the upper substrate 600. The bank 500 may include various materials capable of absorbing light. First to third openings OP1, OP2, and OP3 respectively corresponding to the first to third emission areas EA1, EA2, and EA3 of the first to third light-emitting elements OLED1, OLED2, and OLED3 may be defined in the bank 500. Specifically, the first opening OP1 corresponding to the first emission area EA1 of the first light-emitting element OLED1, the second opening OP2 corresponding to the second light-emitting element OLED2 of the second light-emitting element OLED2, and the third opening OP3 corresponding to the third emission area EA3 of the third light-emitting element OLED3 may be defined in the bank 500 arranged in the display area DA.

In an embodiment, the first opening OP1, the second opening OP2, and the third opening OP3, defined in the bank 500 may respectively correspond to the openings 120OP defined in the pixel-defining layer 120. In an embodiment, the first opening OP1 defined in the bank 500 may correspond to the opening 120OP of the pixel-defining layer 120 defining the first emission area EA1, the second opening OP2 defined in the bank 500 may correspond to the opening 120OP of the pixel-defining layer 120 defining the second emission area EA2, and the third opening OP3 of the bank 500 may correspond to the opening 120OP of the pixel-defining layer 120 defining the third emission area EA3, for example. In other words, the expression that the first opening OP1 to third opening OP3 of the bank 500 correspond to the openings 120OP of the pixel-defining layer 120 that define the first emission area EA1 to the third emission area EA3, respectively, may mean that, when viewed from a direction (a z direction) perpendicular to the upper surface 600a of the upper substrate 600, a shape of an edge of the first opening OP1 to third opening OP3 of the bank 500 is the same as or similar to a shape of an edge of the openings 120OP of the pixel-defining layer 120 that define the first emission area EA1 to the third emission area EA3.

In an embodiment, areas of the first opening OP1 to the third opening OP3 defined in the bank 500 may be greater than areas of the openings 120OP of the pixel-defining layer 120 defining the first emission area EA1 to the third emission area EA3.

In an embodiment, the first quantum dot layer 561 may be arranged in the first opening OP1 defined in the bank 500, the second quantum dot layer 563 may be arranged in the second opening OP2 defined in the bank 500, and the light-transmitting layer 565 may be arranged in the third opening OP3 defined in the bank 500. The first quantum dot layer 561, the second quantum dot layer 563, and the light-transmitting layer 565 may each include the materials described above with reference to FIG. 3.

In an embodiment, the first quantum dot layer 561, the second quantum dot layer 563, and the light-transmitting layer 565 may be provided in the first opening OP1, the second opening OP2, and the third opening OP3 of the bank 500, respectively, through an inkjet printing method.

In an embodiment, the first color filter layer 581, the second color filter layer 583, and the third color filter layer 585 may be arranged on the lower surface 600b of the upper substrate 600. The first color filter layer 581 may be arranged directly on the first quantum dot layer 561, the second color filter layer 583 may be arranged directly on the second quantum dot layer 563, and the third color filter layer 585 may be arranged directly on the light-transmitting layer 565. Accordingly, light converted in the first quantum dot layer 561 may be incident directly on the first color filter layer 581, light converted in the second quantum dot layer 563 may be incident directly on the second color filter layer 583, and light passing through the light-transmitting layer 565 may be incident directly on the third color filter layer 585.

In an embodiment, the first color filter layer 581, the second color filter layer 583, and the third color filter layer 585 may transmit only light of wavelengths belonging to different wavelength bands from each other. Specifically, the first color filter layer 581 may transmit only light of a wavelength belonging to the first wavelength band, the second color filter layer 583 may transmit only light of a wavelength belonging to the second wavelength band, and the third color filter layer 585 may transmit only light of a wavelength belonging to the third wavelength band. In this case, the first wavelength band may be in a range of about 630 nm to about 780 nm, the second wavelength band may be in a range of about 495 nm to about 570 nm, and the third wavelength band may be in a range of about 450 nm to about 495 nm. In other words, the first color filter layer 581 may transmit only light of a wavelength in the range of about 630 nm to about 780 nm, the second color filter layer 583 may transmit only light of a wavelength in the range of about 495 nm to about 570 nm, and the third color filter layer 585 may transmit only light of a wavelength in the range of about 450 nm to about 495 nm.

In an embodiment, the first color filter layer 581 may overlap (or at least partially overlap) the first light-emitting element OLED1 including the first pixel electrode 211. In an embodiment, the first color filter layer 581 may overlap (or at least partially overlap) the first emission area EA1 of the first light-emitting element OLED1, for example. Accordingly, light emitted by the first light-emitting element OLED1 may pass through the first color filter layer 581. This will be described below in greater detail.

In an embodiment, the second color filter layer 583 may overlap (or at least partially overlap) the second light-emitting element OLED2 including the second pixel electrode 213. In an embodiment, the second color filter layer 583 may overlap (or at least partially overlap) the second emission area EA2 of the second light-emitting element OLED2, for example. Thus, light emitted by the second light-emitting element OLED2 may pass through the second color filter layer 583. This will be described below in greater detail.

In an embodiment, the third color filter layer 585 may overlap (or at least partially overlap) the third light-emitting element OLED3 including the third pixel electrode 215. In an embodiment, the third color filter layer 585 may overlap (or at least partially overlap) the third emission area EA3 of the third light-emitting element OLED3, for example. Accordingly, light emitted by the third light-emitting element OLED3 may pass through the third color filter layer 585. This will be described below in greater detail.

In an embodiment, a fourth opening OP4 and a fifth opening OP5 may be defined in the first color filter layer 581. The fourth opening OP4 defined in the first color filter layer 581 may overlap (or at least partially overlap) the second color filter layer 583, and the fifth opening OP5 defined in the first color filter layer 581 may overlap (or at least partially overlap) the third color filter layer 585.

In an embodiment, a sixth opening OP6 and a seventh opening OP7 may be defined in the second color filter layer 583. The sixth opening OP6 defined in the second color filter layer 583 may overlap (or at least partially overlap) the first color filter layer 581, and the seventh opening OP7 defined in the second color filter layer 583 may overlap (or at least partially overlap) the third color filter layer 585.

In an embodiment, an eighth opening OP8 and a ninth opening OP9 may be defined in the third color filter layer 585. The eighth opening OP8 defined in the third color filter layer 585 may overlap (or at least partially overlap) the first color filter layer 581, and the ninth opening OP9 defined in the third color filter layer 585 may overlap (or at least partially overlap) the second color filter layer 583.

In an embodiment, at least a portion of the first color filter layer 581 may be exposed through the sixth opening OP6 defined in the second color filter layer 583 and the eighth opening OP8 defined in the third color filter layer 585. The first color filter layer 581 may be in direct contact with the first quantum dot layer 561 through the sixth opening OP6, and may be in direct contact with the lower surface 600b of the upper substrate 600 through the eighth opening OP8. In other words, the first color filter layer 581 may be in direct contact with the first quantum dot layer 561 in a direction (e.g., a −z direction) toward the lower substrate 100, and the first color filter layer 581 may be in direct contact with the lower surface 600b of the upper substrate 600 in a direction (e.g., a +z direction) toward the upper surface 600a of the upper substrate 600.

Thus, light of a wavelength belonging to the first wavelength band may be emitted from the first pixel PX1 to the outside through the upper substrate 600. Specifically, light of the third wavelength band emitted by the first light-emitting element OLED1 may be converted into light of the first wavelength band while passing through the first quantum dot layer 561 and filtered out while passing through the first color filter layer 581, and thus, light of a wavelength belonging to the first wavelength band may be emitted from the first pixel PX1 to the outside through the upper substrate 600. In addition, light emitted by the first light-emitting element OLED1 may pass through the first quantum dot layer 561 and the first color filter layer 581, and thus, the color purity of light emitted through the upper substrate 600 may be improved.

In an embodiment, at least a portion of the second color filter layer 583 may be exposed through the fourth opening OP4 defined in the first color filter layer 581 and the ninth opening OP9 defined in the third color filter layer 585. The second color filter layer 583 may be in direct contact with the lower surface 600b of the upper substrate 600 through the fourth opening OP4 and the ninth opening OP9. In other words, the second color filter layer 583 may be in direct contact with the second quantum dot layer 563 in the direction (e.g., the −z direction) toward the lower substrate 100, and the second color filter layer 583 may be in direct contact with the lower surface 600b of the upper substrate 600 in the direction (e.g., the +z direction) toward the upper surface 600a of the upper substrate 600.

Accordingly, light of a wavelength belonging to the second wavelength band may be emitted from the second pixel PX2 to the outside through the upper substrate 600. Specifically, light of the third wavelength band emitted by the second light-emitting element OLED2 may be converted into light of the second wavelength band while passing through the second quantum dot layer 563 and filtered out while passing through the second color filter layer 583, and thus, light of a wavelength belonging to the second wavelength band may be emitted from the second pixel PX2 to the outside through the upper substrate 600. In addition, because light emitted by the second light-emitting element OLED2 may pass through the second quantum dot layer 563 and the second color filter layer 583, the color purity of light emitted through the upper substrate 600 may be improved.

In an embodiment, at least a portion of the third color filter layer 585 may be exposed through the fifth opening OP5 defined in the first color filter layer 581 and the seventh opening OP7 defined in the second color filter layer 583. The third color filter layer 585 may be in direct contact with the light-transmitting layer 565 through the fifth opening OP5 and the seventh opening OP7. In other words, the third color filter layer 585 may be in direct contact with the light-transmitting layer 565 in the direction (e.g., the −z direction) toward the lower substrate 100, and the third color filter layer 585 may be in direct contact with the lower surface 600b of the upper substrate 600 in the direction (e.g., the +z direction) toward the upper surface 600a of the upper substrate 600.

Accordingly, light of a wavelength belonging to the third wavelength band may be emitted from the third pixel PX3 to the outside through the upper substrate 600. Specifically, light of the third wavelength band emitted by the third light-emitting element OLED3 may pass through the light-transmitting layer 565 and filtered out while passing through the third color filter layer 585, and thus, light of a wavelength belonging to the third wavelength band may be emitted from the third pixel PX3 to the outside through the upper substrate 600. In addition, because light emitted by the third light-emitting element OLED3 may pass through the light-transmitting layer 565 and the third color filter layer 585, the color purity of light emitted through the upper substrate 600 may be improved.

In an embodiment, at least two color filter layers may overlap each other between the first pixel PX1, the second pixel PX2, and the third pixel PX3. In FIG. 6, the first color filter layer 581, the second color filter layer 583, and the third color filter layer 585 are between the first pixel PX1, the second pixel PX2, and the third pixel PX3. The color filters overlapping each other as described above may serve as a black matrix. In an embodiment, when the first color filter layer 581 transmits only light of a wavelength belonging to the first wavelength band, the second color filter layer 583 transmits only light of a wavelength belonging to the second wavelength band, and the third color filter layer 585 transmits only light of a wavelength belonging to the third wavelength band, no light of any wavelength may pass through these overlapping layers, for example.

In an embodiment, the first color filter layer 581, the second color filter layer 583, and the third color filter layer 585 may be arranged to overlap each other between the upper substrate 600 and the bank 500. Because the first color filter layer 581, the second color filter layer 583, and the third color filter layer 585 are arranged to overlap each other between the upper substrate 600 and the bank 500, a step between the upper substrate 600 and the bank 500 may be maintained constant.

In an embodiment, a protective layer 460 and the filler 400 may be between the lower substrate 100 and the upper substrate 600. The filler 400 may be between the thin-film encapsulation layer 300 and the protective layer 460, and the protective layer 460 may be between the filler 400 and the bank 500.

In an embodiment, the filler 400 may act as a buffer against external pressure or the like. In an embodiment, the filler 400 may include an organic material such as methyl silicone, phenyl silicone, or polyimide. However, the invention is not limited thereto, and the filler 400 may include urethane-based resin, epoxy-based resin, and acryl-based resin, which are organic sealants, or silicone, which is an inorganic sealant.

In an embodiment, the protective layer 460 may be entirely arranged on the filler 400. In addition, the protective layer 460 may be arranged to cover the first quantum dot layer 561, the second quantum dot layer 563, and the light-transmitting layer 565. In an embodiment, because a process of bonding the lower substrate 100 and the upper substrate 600 to each other is performed after forming the first to third color filter layers and the first and second quantum dot layers on the lower surface 600b of the upper substrate 600, the protective layer 460 may cover the first quantum dot layer 561, the second quantum dot layer 563, and the light-transmitting layer 565, which are provided on the lower surface 600b of the upper substrate 600, for example. The protective layer 460 may protect the first quantum dot layer 561, the second quantum dot layer 563, and the light-transmitting layer 565.

In an embodiment, the protective layer 460 may include a single layer or layers of an organic material or an inorganic material. In an embodiment, the protective layer 460 may include general-purpose polymers such as benzocyclobutene ("BCB"), polyimide ("PI"), hexamethyldisiloxane ("HMDSO"), poly(methyl 2-methylpropenoate) ("PMMA"), or polystyrene ("PS"), polymer derivatives having a phenol-based group, acryl-based polymers, imide-based polymers, aryl ether-based polymers, amide-based polymers, fluorine-based polymers, p-xylene-based polymers, vinyl alcohol-based polymers, and any combinations thereof. In an embodiment, the protective layer 460 may include $SiO_x$, $SiN_x$, $SiO_xN_y$, $Al_2O_3$, $TiO_2$, $Ta_2O_5$, $HfO_2$, or $ZnO_x$. In this case, ZnO may include ZnO and/or $ZnO_2$.

In an embodiment, a column spacer 450 may be arranged between the lower substrate 100 and the upper substrate 600. The column spacer 450 may be arranged between the thin-film encapsulation layer 300 and the protective layer 460. The column spacer 450 may overlap (or at least partially overlap) the bank 500. In addition, the column spacer 450 may overlap (or at least partially overlap) the pixel-defining layer 120 arranged therebelow. In an embodiment, the column spacer 450 may not overlap the first to third emission areas EA1, EA2, and EA3 of the first to third light-emitting elements OLED1, OLED2, and OLED3, for example.

In an embodiment, the column spacer 450 may include the same material as that of the bank 500. However, the invention is not limited thereto. In an embodiment, the column spacer 450 may include a material different from that of the bank 500, for example.

Referring to FIGS. 5, 6, and 7, the bank 500 may be arranged in the non-display area NDA of the display apparatus 1. A first dummy opening DOP1, a second dummy opening DOP2, and a third dummy opening DOP3 may be defined in the bank 500 arranged in the non-display area NDA.

In an embodiment, a first dummy quantum dot layer 571 may be arranged in the first dummy opening DOP1 defined in the bank 500, a second dummy quantum dot layer 573 may be arranged in the second dummy opening DOP2, and a dummy light-transmitting layer 575 may be arranged in the third dummy opening DOP3.

In an embodiment, the insulating layer 30, the thin-film encapsulation layer 300, the filler 400, and the protective layer 460 may be sequentially arranged on the lower substrate 100. Because an image is not provided in the non-display area NDA, a light-emitting element may not be arranged in the non-display area NDA. However, a driver or the like may be arranged in the insulating layer 30 of the non-display area NDA.

In an embodiment, the bank 500 may be arranged on the protective layer 460, and the bank 500 may include the first dummy opening DOP1, the second dummy opening DOP2, and the third dummy opening DOP3. The first dummy quantum dot layer 571, the second dummy quantum dot layer 573, and the dummy light-transmitting layer 575 may be respectively arranged in the first dummy opening DOP1, the second dummy opening DOP2, and the third dummy opening DOP3 defined in the bank 500.

In an embodiment, the first dummy quantum dot layer 571 may include the same material as that of the first quantum dot layer 561. In an embodiment, the first dummy quantum dot layer 571 may include the first quantum dots 1152 (refer to FIG. 3), the first scattering particles 1153 (refer to FIG. 3), and the first photosensitive polymer 1151 (refer to FIG. 3), for example.

In an embodiment, the second dummy quantum dot layer 573 may include the same material as that of the second quantum dot layer 563. In an embodiment, the second dummy quantum dot layer 573 may include the second quantum dots 1162 (refer to FIG. 3), the second scattering particles 1163 (refer to FIG. 3), and the second photosensitive polymer 1161 (refer to FIG. 3), for example.

In an embodiment, the dummy light-transmitting layer 575 may include the same material as that of the light-transmitting layer 565. In an embodiment, the dummy light-transmitting layer 575 may include the third scattering particles 1173 (refer to FIG. 3) and the third photosensitive polymer 1171 (refer to FIG. 3).

In an embodiment, the second color filter layer 583, the first color filter layer 581, and the third color filter layer 585 may be sequentially arranged on the first dummy quantum dot layer 571, the second dummy quantum dot layer 573, and the dummy light-transmitting layer 575.

The second color filter layer 583, the first color filter layer 581, and the third color filter layer 585, which are sequentially stacked, may serve as a black matrix. In other words, because light of the first wavelength band to the third wavelength band may not pass through the second color filter layer 583, the first color filter layer 581, and the third color filter layer 585 that are sequentially stacked, light of the first wavelength band to the third wavelength band may not be emitted from the upper substrate 600 that overlaps the first dummy quantum dot layer 571, the second dummy quantum dot layer 573, and the dummy light-transmitting layer 575.

Referring to FIG. 5, the first opening OP1, the second opening OP2, and the third opening OP3 may be defined in the bank 500 in the display area DA, and the first dummy opening DOP1, the second dummy opening DOP2, and the third dummy opening DOP3 may be defined in the bank 500 in the non-display area NDA. In this case, each of the first to third openings OP1, OP2, and OP3 and the first to third dummy openings DOP1, DOP2, and DOP3 may be provided in plural. In an embodiment, a fourth dummy opening DOP4 may be defined in the bank 500 in the display area DA. The fourth dummy opening DOP4 may also be provided in plural.

As described above, the first quantum dot layer 561 may be arranged in the first opening OP1, the second quantum dot layer 563 may be arranged in the second opening OP2, and the light-transmitting layer 565 may be arranged in the third opening OP3. In addition, the first dummy quantum dot layer 571 may be arranged in the first dummy opening DOP1, the second dummy quantum dot layer 573 may be arranged in the second dummy opening DOP2, and the dummy light-transmitting layer 575 may be arranged in the third dummy opening DOP3. In this case, the first quantum dot layer 561 and the first dummy quantum dot layer 571 may include the same material as each other, the second quantum dot layer 563 and the second dummy quantum dot layer 573 may include the same material as each other, and the light-transmitting layer 565 and the dummy light-transmitting layer 575 may include the same material as each other.

In an embodiment, the first quantum dot layer 561 and the light-transmitting layer 565 closest to the first quantum dot layer 561 may be arranged in the same row. In an embodiment, the first quantum dot layer 561 and the light-transmitting layer 565 closest to the first quantum dot layer 561 may be arranged to be spaced apart from each other in a first direction (an x direction), and may be alternately arranged in the same row as each other, for example.

In an embodiment, the first quantum dot layer 561 and the second quantum dot layer 563 closest to the first quantum dot layer 561 may be arranged in different rows from each other. In an embodiment, the first quantum dot layer 561 and the second quantum dot layer 563 closest to the first quantum dot layer 561 may be arranged to be diagonally spaced apart from each other, for example. The second quantum dot layers 563 may be arranged to be spaced apart from each other in the first direction (the x direction) with the fourth dummy opening DOP4 therebetween.

In an embodiment, the second quantum dot layer 563 and the fourth dummy opening DOP4 may be alternately arranged in a first row 1N, the first quantum dot layer 561 and the light-transmitting layer 565 may be alternately arranged in a second row 2N, and the second quantum dot layer 563 and the fourth dummy opening DOP4 may be alternately arranged again in a third row 3N, for example. This arrangement may be repeated up to an $N^{th}$ row.

In an embodiment, the first dummy quantum dot layer 571 and the dummy light-transmitting layer 575 closest to the first dummy quantum dot layer 571 may be arranged in the same row. In an embodiment, the first dummy quantum dot layer 571 and the dummy light-transmitting layer 575 closest to the first dummy quantum dot layer 571 may be arranged to be spaced apart from each other in the first direction (the x direction), for example.

In an embodiment, the first dummy quantum dot layer 571 and the second dummy quantum dot layer 573 closest to the first dummy quantum dot layer 571 may be arranged in different rows from each other. In an embodiment, the first dummy quantum dot layer 571 and the second dummy quantum dot layer 573 closest to the first dummy quantum dot layer 571 may be arranged to be diagonally spaced apart from each other, for example.

In an embodiment, the first quantum dot layer 561 and the light-transmitting layer 565 arranged in the display area DA may be arranged in the same row as a row in which the second dummy quantum dot layer 573 arranged in the non-display area NDA is arranged, and the second quantum dot layer 563 in the display area DA may be arranged in the same row as a row in which the first dummy quantum dot layer 571 and the dummy light-transmitting layer 575 arranged in the non-display area NDA are arranged.

Conversely, the first quantum dot layer 561 and the light-transmitting layer 565 arranged in the display area DA may be arranged in a different row from a row in which the first dummy quantum dot layer 571 and the dummy light-transmitting layer 575 arranged in the non-display area NDA are arranged, and the second quantum dot layer 563 arranged in the display area DA may be arranged in a different row from a row in which the second dummy quantum dot layer 573 arranged in the non-display area NDA is arranged.

In an embodiment, the second quantum dot layer 563, the first dummy quantum dot layer 571, and the dummy light-transmitting layer 575 may be arranged in the first row 1N, the first quantum dot layer 561, the light-transmitting layer 565, and the second dummy quantum dot layer 573 may be arranged in the second row 2N, and the second quantum dot layer 563, the first dummy quantum dot layer 571, and the dummy light-transmitting layer 575 may be arranged in the third row 3N. This arrangement may be repeated up to the $N^{th}$ row, for example.

In other words, the first quantum dot layer 561 and the first dummy quantum dot layer 571 including the same material as each other may be arranged in different rows from each other, the second quantum dot layer 563 and the second dummy quantum dot layer 573 including the same material as each other may be arranged in different rows from each other, and the light-transmitting layer 565 and the dummy light-transmitting layer 575 including the same material as each other may be arranged in different rows from each other. This will be described below in greater detail.

In an embodiment, the fourth dummy opening DOP4 may be defined in the bank 500 arranged in the display area DA. Because the fourth dummy opening DOP4 is defined in the bank 500 arranged in the display area DA, the display quality of the display apparatus 1 may be improved.

Figure 8:
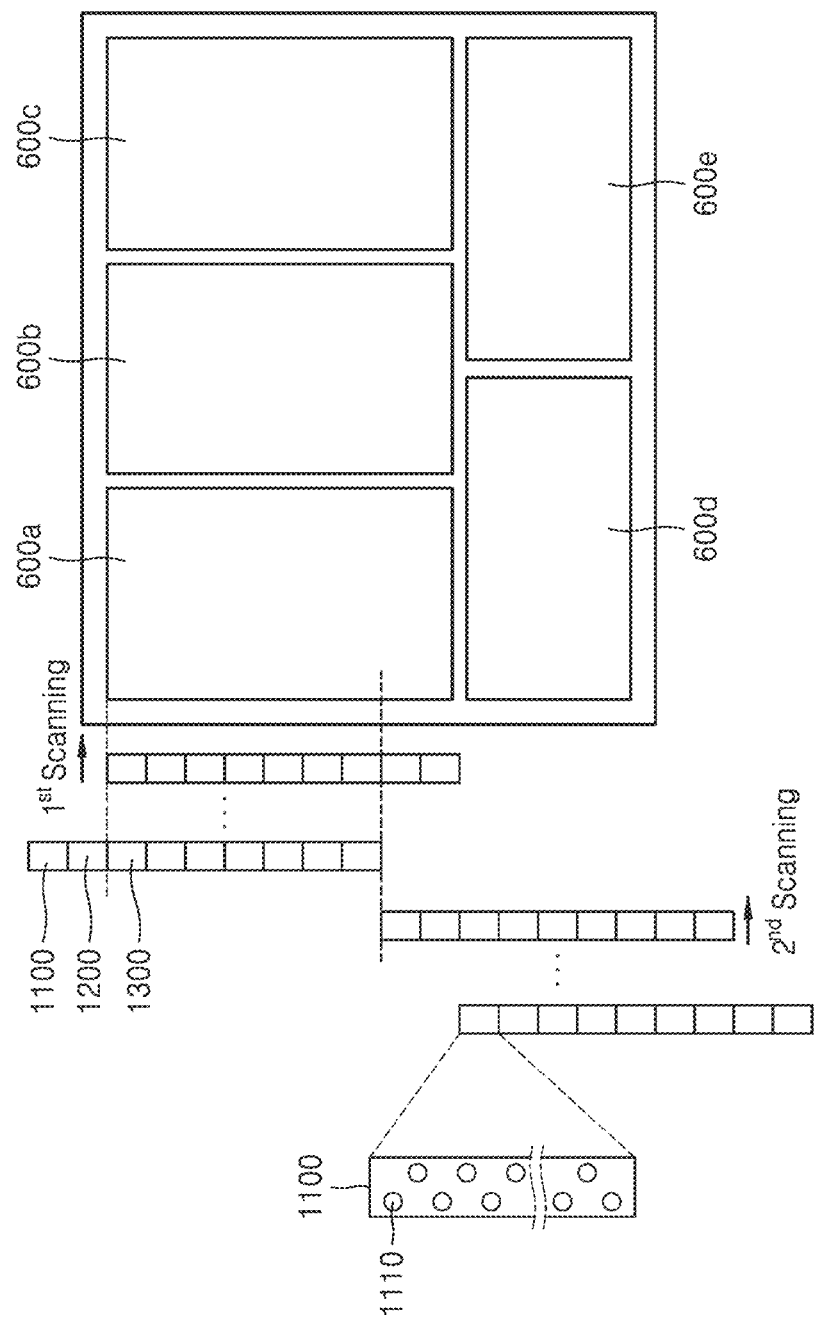
FIG. 8 is a plan view schematically illustrating an embodiment of a method of manufacturing a display apparatus.
Figure 9:
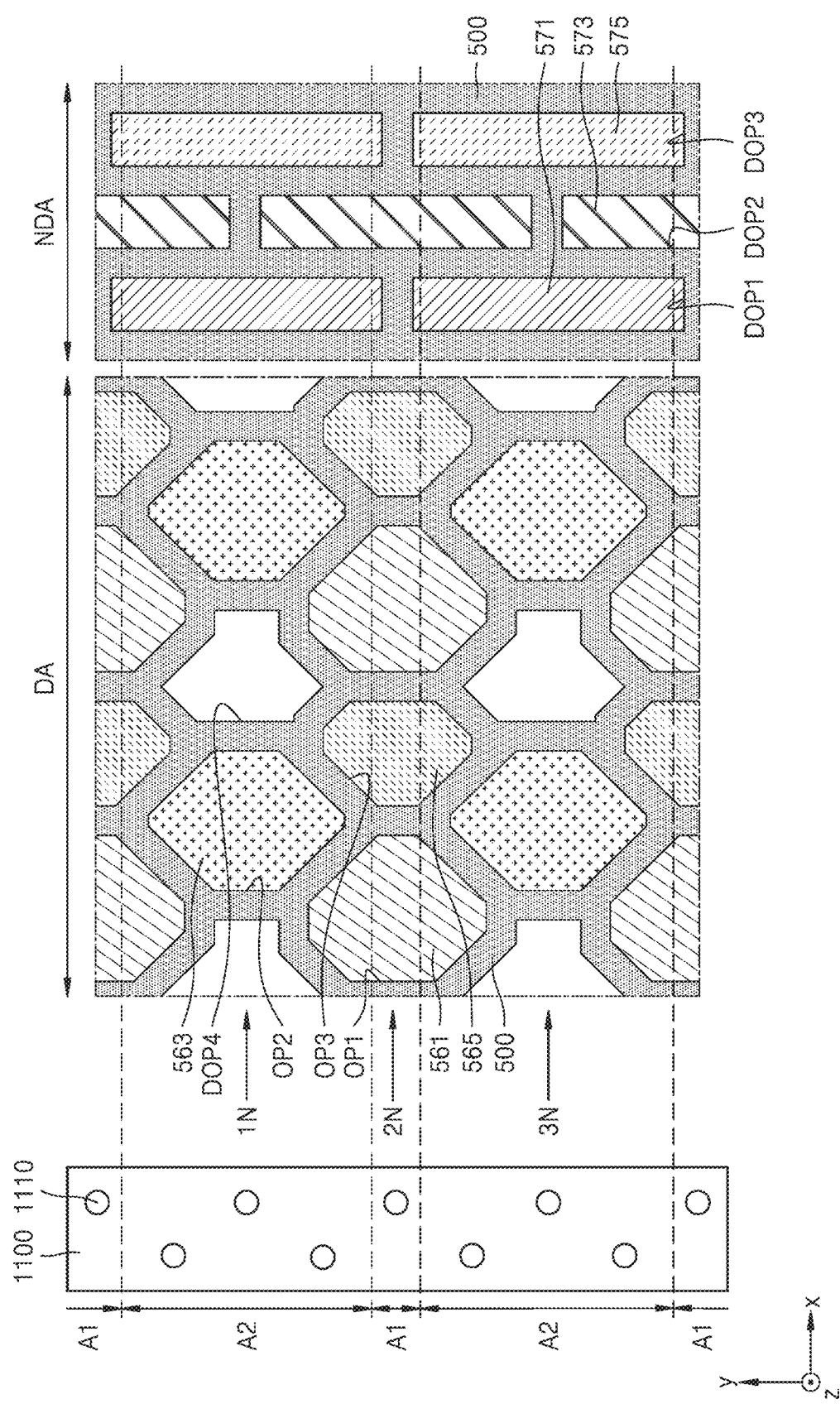
FIG. 9 is a plan view schematically illustrating an embodiment of a method of manufacturing a display apparatus.

FIG. 8 is a plan view schematically illustrating an embodiment of a method of manufacturing a display apparatus, and FIG. 9 is a plan view schematically illustrating an embodiment of a method of manufacturing a display apparatus. Specifically, FIG. 9 is a diagram for explaining an effect of providing the first dummy opening DOP1, the second dummy opening DOP2, and the third dummy opening DOP3 in the non-display area NDA. A first head portion 1100 shown in FIG. 9 corresponds to a head portion 1100 for forming the first quantum dot layer 561.

Referring to FIGS. 8 and 9, the first quantum dot layer 561, the second quantum dot layer 563, and the light-transmitting layer 565 of the display apparatus in an embodiment may be formed or provided by an inkjet printing process.

In an embodiment, the first to third head portions 1100, 1200, and 1300 may reciprocate in the first direction (the x direction). The head portion may include the first head portion 1100 for discharging first ink, the second head portion 1200 for discharging second ink, and the third head portion 1300 for discharging third ink. In this case, the first ink may include the first quantum dots 1152 (refer to FIG. 3), the first scattering particles 1153 (refer to FIG. 3), and the first photosensitive polymer 1151 (refer to FIG. 3) each forming the first quantum dot layer 561 and the first dummy quantum dot layer 571, the second ink may include the second quantum dots 1162 (refer to FIG. 3), the second scattering particles 1163 (refer to FIG. 3), and the second photosensitive polymer 1161 (refer to FIG. 3) each forming the second quantum dot layer 563 and the second dummy quantum dot layer 573, and the third ink may include the third scattering particles 1173 (refer to FIG. 3) and the third photosensitive polymer 1171 (refer to FIG. 3) each forming the light-transmitting layer 565 and the dummy light-transmitting layer 575.

In an embodiment, the first to third head portions 1100, 1200, and 1300 may each include at least two nozzles 1110. The nozzles 1110 may receive ink from the first to third head portions 1100, 1200, and 1300 and discharge the ink toward the upper substrates 600*a*, 600*b*, 600*c*, 600*d*, and 600*e*. In this case, the upper substrates 600*a*, 600*b*, 600*c*, 600*d*, and 600*e* become application target objects, and from among the surfaces of the upper substrates 600*a*, 600*b*, 600*c*, 600*d*, and 600*e*, the surface facing the nozzles 1110 becomes an application target surface. Ink, which is an application material, may be in a liquid state.

In an embodiment, the first to third head portions 1100, 1200, and 1300 may reciprocate in the first direction (the x direction) on a stage. The first to third head portions 1100, 1200, and 1300 may discharge ink to a desired position while scanning the upper substrates 600*a*, 600*b*, 600*c*, 600*d*, and 600*e*. In this case, scanning may be performed from top to bottom as a $1^{st}$ scanning, and scanning may be performed from bottom to top as a $2^{nd}$ scanning.

In an embodiment, the first head portion 1100 may discharge the first ink to the first opening OP1 while reciprocating in the first direction (the x direction). The first quantum dot layer 561 may be provided by discharging the first ink to the first opening OP1.

In an embodiment, the nozzles 1110 disposed in a first area A1 of the first head portion 1100 pass above the first openings OP1, and thus, the first ink may be discharged from the nozzles 1110 disposed in the first area A1. However, because the nozzles 1110 in a second area A2 of the first head portion 1100 do not pass above the first openings OP1, the first ink may not be discharged from the nozzles 1110 disposed in the second area A2. In this case, in the nozzle 1110 that is not ejected for a long period of time, precipitation of a material such as a first scattering particles (e.g., $TiO_2$) having a high density from among components included in the first ink may occur. In addition, the concentration of the first scattering particles (e.g., $TiO_2$) in the first quantum dot layer 561 later formed or provided when the precipitated first scattering particles (e.g., $TiO_2$) is discharged may increase, thereby causing staining.

Although only the first quantum dot layer 561 is described with reference to FIG. 9, staining may also occur in the second quantum dot layer 563 and the light-transmitting layer 565 for the reason as described above. In particular, staining may occur more in the light-transmitting layer 565 having a higher concentration of scattering particles than in the first quantum dot layer 561 and the second quantum dot layer 563.

The first opening OP1, the second opening OP2, and the third opening OP3 may be defined in the bank 500 in the display area DA, and the first dummy opening DOP1, the second dummy opening DOP2, and the third dummy opening DOP3 may be defined in the bank 500 in the non-display area NDA.

The first opening OP1 and the third opening OP3 arranged in the display area DA may be arranged in a different row from a row in which the first dummy opening DOP1 and the third dummy opening DOP3 arranged in the non-display area NDA are arranged, and the second opening OP2 arranged in the display area DA may be arranged in a different row from a row in which the second dummy opening DOP2 arranged in the non-display area NDA is arranged.

In an embodiment, the second opening OP2, the first dummy opening DOP1, and the third dummy opening DOP3 may be arranged in the first row 1N, the first opening OP1, the third opening OP3, and the second dummy opening DOP2 may be arranged in the second row 2N, and the second opening OP2, the first dummy opening DOP1, and the third dummy opening DOP3 may be arranged in the third row 3N, for example. This arrangement may be repeated up to an $N^{th}$ row.

As will be described later, the first opening OP1 and the first dummy opening DOP1, to which the same ink (e.g., the first ink) is discharged, may be arranged in different rows from each other, and the second opening OP2 and the second dummy opening DOP2, to which the same ink (e.g., the second ink) is discharged, may be arranged in different rows from each other, and the third opening OP3 and the third dummy opening DOP3, to which the same ink (e.g., the third ink) is discharged, may be arranged in different rows from each other.

In an embodiment, while the first head portion 1100 reciprocates in the first direction (the x direction), the first head portion 1100 may discharge the first ink to the first opening OP1 and discharge the first ink to the first dummy opening DOP1. The first quantum dot layer 561 may be provided by discharging the first ink to the first opening OP1, and the first dummy quantum dot layer 571 may be provided by discharging the first ink to the first dummy opening DOP1.

Specifically, the nozzles 1110 disposed in the first area A1 of the first head portion 1100 pass above the first openings OP1, and thus, the first ink may be discharged from the nozzles 1110 disposed in the first area A1. In addition, the nozzles 1110 disposed in the second area A2 of the first head portion 1100 pass above the first dummy openings DOP1, and thus, the first ink may also be discharged from the nozzles 1110 disposed in the second area A2.

Although only the first opening OP1 and the first dummy opening DOP1 are described with reference to FIG. 9, the embodiment may also be applied to the second opening OP2 and the second dummy opening DOP2 and to the third opening OP3 and the third dummy opening DOP3 in the same or similar manner.

Thus, because the first opening OP1 in the display area DA and the first dummy opening DOP1 in the non-display area NDA are defined in the bank 500, and the first opening and the first dummy opening DOP defined in the bank 500 are arranged in different rows from each other, the number of nozzles 1110 used (or available) in an inkjet printing process is increased and the concentration of the first scattering particles (e.g., $TiO_2$) within the first quantum dot layer 561 is prevented from being increased, thus preventing or minimizing the occurrence of staining.

Because the second opening OP2 in the display area DA and the second dummy opening DOP2 in the non-display area NDA are defined in the bank 500, and the second opening OP2 and the second dummy opening DOP2 defined in the bank 500 are arranged in different rows from each other, the number of nozzles used (or available) in the inkjet printing process is increased, and the concentration of the second scattering particles (e.g., $TiO_2$) within the second quantum dot layer 563 may be prevented from being increased, thus preventing or minimizing the occurrence of staining.

Because the third opening OP3 in the display area DA and the third dummy opening DOP3 in the non-display area NDA are defined in the bank 500, and the third opening OP3 and the third dummy opening DOP3 defined in the bank 500 are arranged in different rows from each other, the number of nozzles used (or available) in the inkjet printing process is increased, and the concentration of the third scattering particles (e.g., $TiO_2$) within the light-transmitting layer 565 is prevented from being increased, thus preventing or minimizing the occurrence of staining.

In addition, although not shown, only the first dummy opening DOP1 and the second dummy opening DOP2 may be defined in the bank 500 arranged in the non-display area NDA. In other words, the third dummy opening DOP3 may be omitted. In this case, the first ink may be discharged to the first dummy opening DOP1, and the second ink may be discharged to the second dummy opening DOP2.

Figure 10:
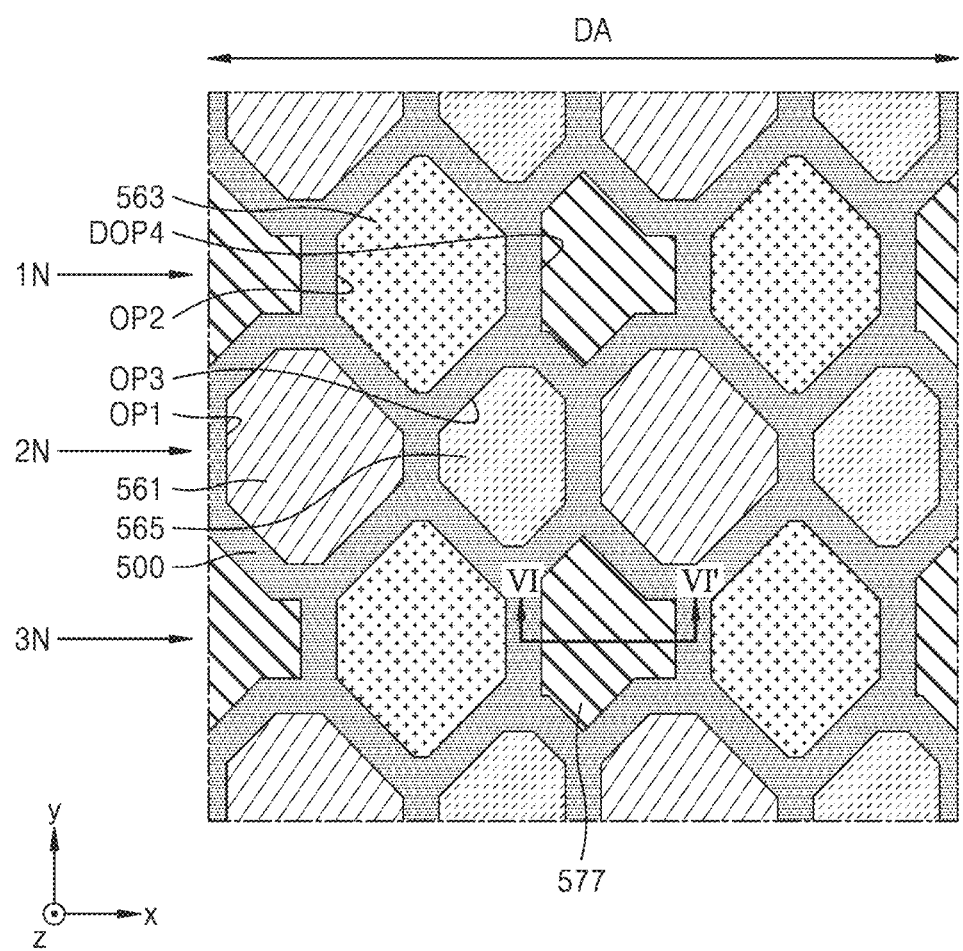
FIG. 10 is a plan view schematically illustrating an embodiment of a display apparatus.
Figure 11:
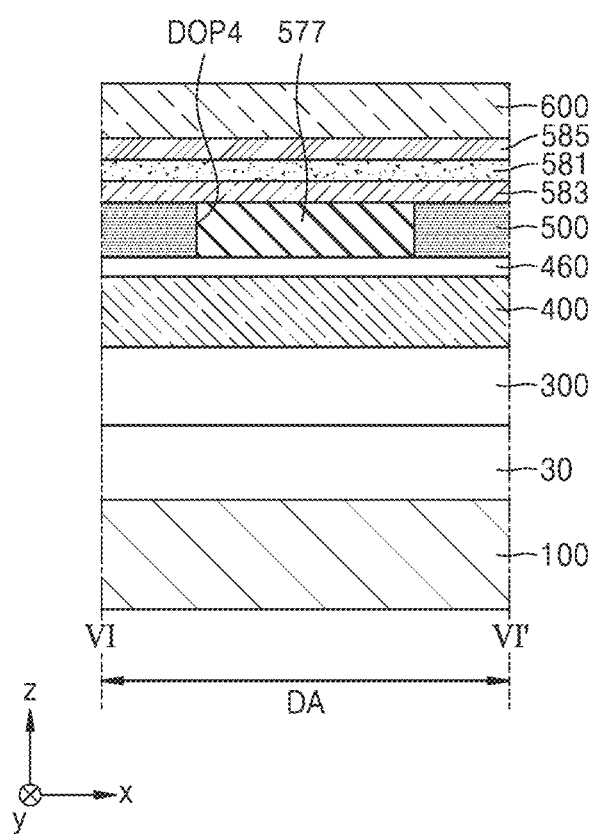
FIG. 11 is a cross-sectional view schematically illustrating an embodiment of a display apparatus.

FIG. 10 is a plan view schematically illustrating an embodiment of a display apparatus, and FIG. 11 is a cross-sectional view schematically illustrating an embodiment of a display apparatus. The embodiment of FIGS. 10 and 11 is different from the embodiment of FIGS. 5 and 6 in that a third dummy quantum dot layer 577 is arranged in the fourth dummy opening DOP4. In FIGS. 10 and 11, the same reference symbols as those of FIGS. 5 and 6 denote the same, and the redundant descriptions thereof are omitted. In addition, FIG. 11 corresponds to a cross-sectional view of the display apparatus in FIG. 10, taken along line VI-VI' in FIG. 10.

Referring to FIGS. 10 and 11, the insulating layer 30 may be arranged on the lower substrate 100. As described above with reference to FIG. 4, the insulating layer 30 may include the buffer layer 111, the first insulating layer 113, the second insulating layer 115, and the planarization layer 117, and the thin-film transistor TFT may be arranged in the insulating layer 30. However, the invention is not limited thereto. In an embodiment, the thin-film transistor TFT may be omitted, for example.

The thin-film encapsulation layer 300, the filler 400, and the protective layer 460 may be sequentially arranged above the insulating layer 30, and the bank 500 may be arranged on the protective layer 460. The fourth dummy opening DOP4 may be defined in the bank 500.

In an embodiment, the third dummy quantum dot layer 577 may be arranged in the fourth dummy opening DOP4 defined in the bank 500 arranged in the display area DA. In an embodiment, the third dummy quantum dot layer 577 may include the same material as that of the first quantum dot layer 561. In an embodiment, the third dummy quantum dot layer 577 may include the first quantum dots 1152 (refer to FIG. 3), the first scattering particles 1153 (refer to FIG. 3), and the first photosensitive polymer 1151 (refer to FIG. 3), for example. In some embodiments, the third dummy quantum dot layer 577 may include the same material as the light-transmitting layer 565. In an embodiment, the third dummy quantum dot layer 577 may include the third scattering particles 1173 (refer to FIG. 3) and the third photosensitive polymer 1171 (refer to FIG. 3), for example. In some embodiments, the third dummy quantum dot layer 577 may include the same material as that of the first quantum dot layer 561 and the light-transmitting layer 565. In an embodiment, the third dummy quantum dot layer 577 may include the first quantum dots 1152, the first scattering particles 1153, the first photosensitive polymer 1151, the third scattering particles 1173, and the third photosensitive polymer 1171. However, the invention is not limited thereto. In an embodiment, the third dummy quantum dot layer 577 may have the same material as at least one of the first quantum dot layer 561, the second quantum dot layer 563, and the light-transmitting layer 565, for example.

In an embodiment, the second color filter layer 583, the first color filter layer 581, and the third color filter layer 585 may be arranged above the third dummy quantum dot layer 577.

The second color filter layer 583, the first color filter layer 581, and the third color filter layer 585, which are sequentially stacked, may serve as a black matrix. In other words, light of the first wavelength band to the third wavelength band may not pass through the second color filter layer 583, the first color filter layer 581, and the third color filter layer 585 that are sequentially stacked, and thus, light of the first wavelength band to the third wavelength band may not be emitted from the upper substrate 600 overlapping the third dummy quantum dot layer 577.

Figure 12:
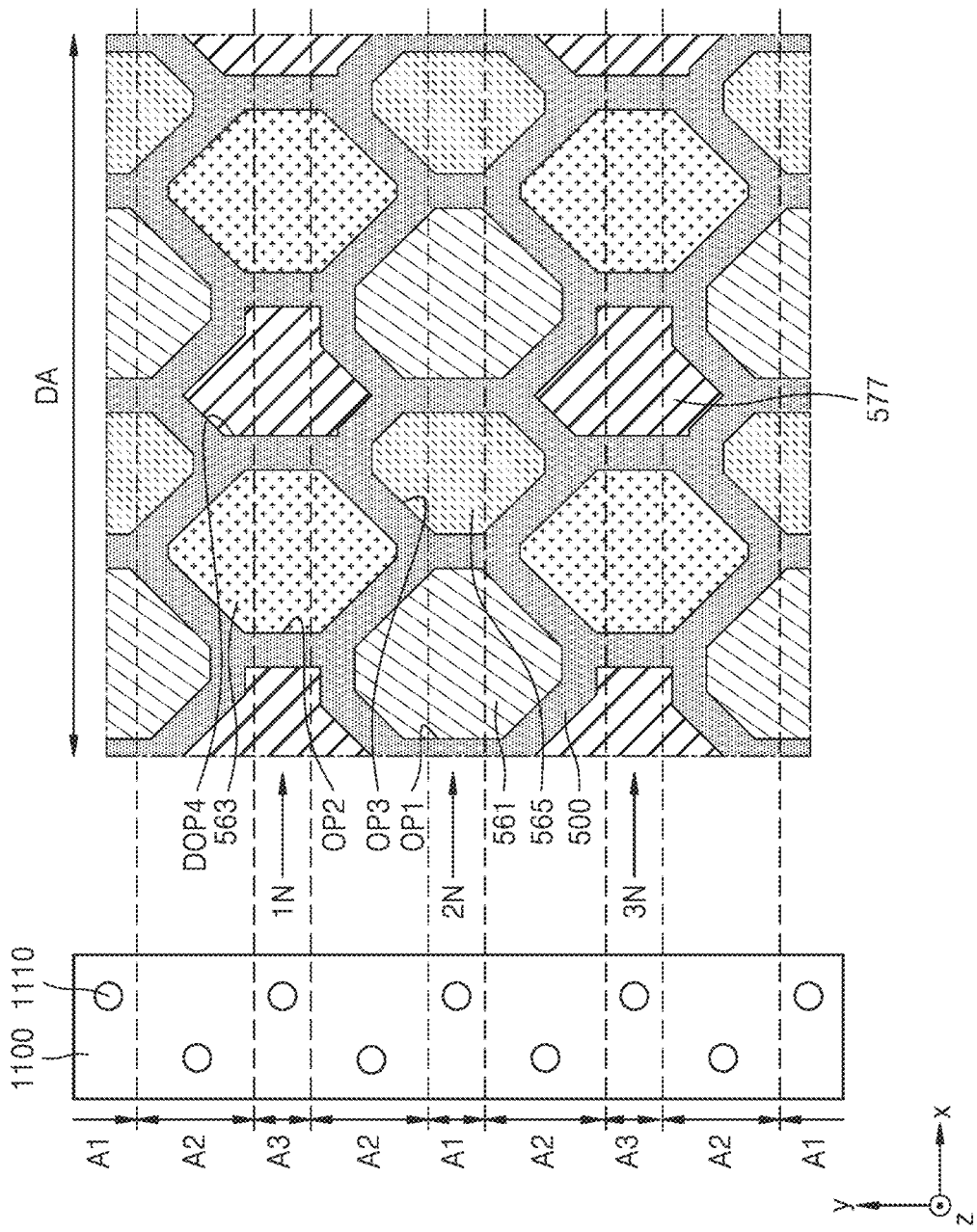
FIG. 12 is a plan view schematically illustrating an embodiment of a method of manufacturing a display apparatus.

FIG. 12 is a plan view schematically illustrating an embodiment of a method of manufacturing a display apparatus. In FIG. 12, the same reference symbols as those of FIG. 9 denote the same, and redundant descriptions thereof are omitted.

Referring to FIGS. 8 and 12, the first quantum dot layer 561, the second quantum dot layer 563, and the light-transmitting layer 565 of the display apparatus in an embodiment may be formed or provided by an inkjet printing process.

In an embodiment, the first head portion 1100 may discharge the first ink to the first opening OP1 while reciprocating in the first direction (the x direction). The first quantum dot layer 561 may be provided by discharging the first ink to the first opening OP1.

In an embodiment, the nozzles 1110 disposed in the first area A1 of the first head portion 1100 pass above the first openings OP1, and thus, the first ink may be discharged from the nozzles 1110 disposed in the first area A1. However, because the nozzles 1110 in the second area A2 of the first head portion 1100 do not pass above the first openings OP1, the first ink may not be discharged from the nozzles 1110 disposed in the second area A2. In this case, in the nozzle 1110 that is not ejected for a long period of time, precipitation of a material such as a first scattering particles (e.g., $TiO_2$) having a high density from among components included in the first ink may occur. In addition, the concentration of the first scattering particles (e.g., $TiO_2$) within the first quantum dot layer 561 which are later formed or provided when the first scattering particles (e.g., $TiO_2$) are discharged may be increased, thereby causing staining. Although only the first quantum dot layer 561 is described with reference to FIG. 9, staining may also occur in the light-transmitting layer 565 for the reason as described above.

In an embodiment, the bank 500 may be arranged in the display area DA, and the fourth dummy opening DOP4 may be defined in the bank 500. The fourth dummy opening DOP4 defined in the bank 500 may be arranged in the same row as a row in which the second opening OP2 defined in the bank 500 is arranged, and the fourth dummy opening DOP4 defined in the bank 500 may be arranged in a different row from a row in which the first opening OP1 and the third opening OP3, defined in the bank 500 are arranged.

In an embodiment, the second opening OP2 and the fourth dummy opening DOP4 may be arranged in the first row 1N, the first opening OP1 and the third opening OP3 may be arranged in the second row 2N, and the second opening OP2 and the fourth dummy opening DOP4 may be arranged in the third row 3N. This arrangement may be repeated up to the $N^{th}$ row, for example.

In an embodiment, while the first head portion 1100 reciprocates in the first direction (the x direction), the first head portion 1100 may discharge the first ink to the first opening OP1 and discharge the first ink to the fourth dummy opening DOP4. The first quantum dot layer 561 may be provided by discharging the first ink to the first opening OP1, and the third dummy quantum dot layer 577 may be provided by discharging the first ink to the fourth dummy opening DOP4.

Specifically, the nozzles 1110 disposed in the first area A1 of the first head portion 1100 pass above the first openings OP1, and thus, the first ink may be discharged from the nozzles 1110 disposed in the first area A1. In addition, the nozzles 1110 disposed in a third area A3 of the first head portion 1100 pass above the fourth dummy opening DOP4, and thus, the first ink may also be discharged from the nozzles 1110 disposed in the third area A3.

Although only the first ink is described with reference to FIG. 12, the embodiment may be applied to the third ink in the same or similar manner. In other words, the embodiment may be applied in the same or similar manner to a process of forming the light-transmitting layer 565.

In an embodiment, the first ink and/or the third ink may be discharged to the fourth dummy opening DOP4. In this case, the total amount of ink discharged to the fourth dummy opening DOP4 may be about 10% to about 90% of a volume of the fourth dummy opening DOP4.

Thus, because the first opening OP1 and the fourth dummy opening DOP4 are defined in the bank 500 in the display area DA, and the first opening OP1 and the fourth dummy opening DOP4 defined in the bank 500 are arranged in different rows from each other, the number of nozzles 1110 used (or available) in an inkjet printing process is increased, and the concentration of the first scattering particles (e.g., TiO$_2$) in the first quantum dot layer 561 is prevented from being increased, thus preventing or minimizing the occurrence of staining.

Because the third opening OP3 and the fourth dummy opening DOP4 are defined in the bank 500 in the display area DA, and the third opening OP3 and the fourth dummy opening DOP4 defined in the bank 500 are arranged in different rows from each other, the number of nozzles used (or available) in the inkjet printing process is increased, and the concentration of the third scattering particles (e.g., TiO$_2$) in the light-transmitting layer 565 is prevented from being increased, thus preventing or minimizing the occurrence of staining.

FIG. 13 is a plan view schematically illustrating an embodiment of a display apparatus. The embodiment of FIG. 13 is different from that of FIG. 5 in that a fifth dummy opening DOP5 is provided in the display area DA that is adjacent to the non-display area NDA. In FIG. 13, the same reference symbols as those of FIG. 5 denote the same, and redundant descriptions thereof are omitted.

Referring to FIG. 13, the fifth dummy opening DOP5 may be arranged in the display area DA adjacent to the non-display area NDA. Specifically, the fifth dummy opening DOP5 may be defined in the bank 500 on the display area DA that is adjacent to the non-display area NDA. Because the fifth dummy opening DOP5 is defined in the bank 500 on the display area DA that is adjacent to the non-display area NDA, the uniformity of image quality may be improved and the display quality may also be improved.

In addition, although not shown, dummy layers including the same material as one of the first quantum dot layer 561, the second quantum dot layer 563, and the light-transmitting layer 565 may be arranged in the fifth dummy opening DOP5 defined in the bank 500.

By the embodiments of the invention configured as described above, a display apparatus with improved display quality may be implemented by increasing the number of available nozzles. However, the scope of the invention is not limited to the above effects.

It should be understood that embodiments described herein should be considered in a descriptive sense only and not for purposes of limitation. Descriptions of features or advantages within each of the embodiments should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
   a first substrate comprising a display area and a non-display area surrounding the display area;
   a second substrate on the first substrate;
   a bank in which a first opening in the display area and a first dummy opening in the non-display area are defined;
   a first quantum dot layer filling the first opening; and
   a first dummy quantum dot layer filling the first dummy opening,
   wherein each of the first quantum dot layer and the first dummy quantum dot layer comprises first quantum dots and first scattering particles.

2. The display apparatus of claim 1, wherein a second opening is further defined in the bank in the display area and a second dummy opening is further defined in the bank in the non-display area,
   the display apparatus further comprises a second quantum dot layer filling the second opening and a second dummy quantum dot layer filling the second dummy opening, and
   each of the second quantum dot layer and the second dummy quantum dot layer comprises second quantum dots and second scattering particles.

3. The display apparatus of claim 2, wherein a third opening is further defined in the bank in the display area and a third dummy opening is further defined in the bank in the non-display area,
   the display apparatus further comprises a light-transmitting layer filling the third opening and a dummy light-transmitting layer filling the third dummy opening, and
   each of the light-transmitting layer and the dummy light-transmitting layer comprises third scattering particles.

4. The display apparatus of claim 3, wherein the first quantum dot layer and the light-transmitting layer closest to the first quantum dot layer are disposed in a same row as each other, and
   the first quantum dot layer and the second quantum dot layer closest to the first quantum dot layer are disposed in different rows from each other.

5. The display apparatus of claim 4, wherein the first quantum dot layer and the first dummy quantum dot layer are disposed in different rows from each other, and
   the second quantum dot layer and the first dummy quantum dot layer are disposed in a same row.

6. The display apparatus of claim 3, further comprising:
   a first color filter layer disposed on a surface of the second substrate which faces the first substrate and overlapping the first quantum dot layer;
   a second color filter layer disposed on the surface of the second substrate and overlapping the second quantum dot layer; and
   a third color filter layer disposed on the surface of the second substrate and overlapping the light-transmitting layer.

7. The display apparatus of claim 6, wherein a fourth opening overlapping the second opening and a fifth opening overlapping the third opening are defined in the first color filter layer,
- a sixth opening overlapping the first opening and a seventh opening overlapping the third opening are defined in the second color filter layer, and
- an eighth opening overlapping the first opening and a ninth opening overlapping the second opening are defined in the third color filter layer.

8. The display apparatus of claim 6, wherein at least two of the first color filter layer, the second color filter layer, and the third color filter layer are disposed between the bank and the second substrate.

9. The display apparatus of claim 6, wherein the first dummy quantum dot layer overlaps the first color filter layer, the second color filter layer, and the third color filter layer.

10. The display apparatus of claim 3, further comprising a protective layer between the first quantum dot layer and the first substrate, between the second quantum dot layer and the first substrate, and between the light-transmitting layer and the first substrate.

11. The display apparatus of claim 3, further comprising a column spacer between the first substrate and the bank.

12. The display apparatus of claim 3, further comprising:
- a first light-emitting element disposed between the first substrate and the second substrate and comprising a first emission area overlapping the first quantum dot layer;
- a second light-emitting element disposed between the first substrate and the second substrate and comprising a second emission area overlapping the second quantum dot layer; and
- a third light-emitting element disposed between the first substrate and the second substrate and comprising a third emission area overlapping the light-transmitting layer.

13. The display apparatus of claim 12, wherein each of the first light-emitting element, the second light-emitting element, and the third light-emitting element emits light belonging to a same wavelength.

14. The display apparatus of claim 12, further comprising a thin-film encapsulation layer which covers the first light-emitting element, the second light-emitting element, and the third light-emitting element.

15. The display apparatus of claim 14, further comprising a filler between the first substrate and the second substrate, wherein the filler is arranged on the thin-film encapsulation layer.

16. The display apparatus of claim 3, wherein a fourth dummy opening in the display area is further defined in the bank,
- the display apparatus further comprises a third dummy quantum dot layer filling the fourth dummy opening, and
- the third dummy quantum dot layer comprises at least one of the first quantum dots, the second quantum dots, and the third scattering particles.

17. A display apparatus comprising:
- a first substrate comprising a display area and a non-display area surrounding the display area;
- a second substrate on the first substrate;
- a bank in which a first opening in the display area and a first dummy opening in the non-display area are defined;
- a first quantum dot layer filling the first opening; and
- a first dummy quantum dot layer filling the first dummy opening,
- wherein the first quantum dot layer and the first dummy quantum dot layer are arranged in different rows from each other.

18. The display apparatus of claim 17, wherein a second opening and a third opening are further defined in the bank in the display area and a second dummy opening and a third dummy opening are further defined in the bank in the non-display area, and
- the display apparatus further comprises a second quantum dot layer filling the second opening, a light-transmitting layer filling the third opening, a second dummy quantum dot layer filling the second dummy opening, and a dummy light-transmitting layer filling the third dummy opening.

19. The display apparatus of claim 18, wherein the first quantum dot layer and the light-transmitting layer closest to the first quantum dot layer are disposed in a same row as each other, and
- the first quantum dot layer and the second quantum dot layer closest to the first quantum dot layer are disposed in different rows from each other.

20. The display apparatus of claim 19, wherein the second quantum dot layer and the first dummy quantum dot layer are disposed in a same row.

* * * * *